(12) United States Patent
Pidutti et al.

(10) Patent No.: US 10,381,919 B2
(45) Date of Patent: Aug. 13, 2019

(54) RECTIFIER DEVICE WITH SAFETY THRESHOLD

(71) Applicant: Infineon Technologies AG, Neubiberg (DE)

(72) Inventors: Albino Pidutti, Martignacco (IT); Damiano Gadler, Villach (AT); Herbert Gietler, Villach (AT); Michael Lenz, Zorneding (DE); Yavuz Kilic, Villach (AT); Ioannis Pachnis, Villach (AT)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 15/379,055

(22) Filed: Dec. 14, 2016

(65) Prior Publication Data
US 2018/0166971 A1   Jun. 14, 2018

(51) Int. Cl.
| | |
|---|---|
| *H02M 1/32* | (2007.01) |
| *H01L 29/78* | (2006.01) |
| *H02M 1/08* | (2006.01) |
| *H02M 7/217* | (2006.01) |
| *H02M 7/219* | (2006.01) |
| *H01L 29/10* | (2006.01) |

(52) U.S. Cl.
CPC .......... *H02M 1/32* (2013.01); *H01L 29/7813* (2013.01); *H02M 1/08* (2013.01); *H02M 7/217* (2013.01); *H02M 7/219* (2013.01); *H01L 29/1095* (2013.01)

(58) Field of Classification Search
CPC . H02M 1/32; H02M 7/217; H02M 2007/2195
See application file for complete search history.

(56) References Cited

U.S. PATENT DOCUMENTS

| | | | |
|---|---|---|---|
| 5,748,463 A | 5/1998 | Tsutsui et al. | |
| 6,137,668 A | 10/2000 | Feldtkeller | |
| 6,563,726 B1 * | 5/2003 | Hirst ..................... | H02M 7/219 363/127 |
| 6,768,623 B1 | 7/2004 | Shen | |
| 7,842,568 B2 | 11/2010 | Anderson et al. | |

(Continued)

OTHER PUBLICATIONS

Office Action from U.S. Appl. No. 15/379,007, dated Sep. 29, 2017, 7 pp.

(Continued)

*Primary Examiner* — Fred E Finch, III
*Assistant Examiner* — Ishrat Jamali
(74) *Attorney, Agent, or Firm* — Shumaker & Sieffert, P.A.

(57) ABSTRACT

A rectifier is described herein. According to one example, the rectifier includes a semiconductor substrate and further includes an anode terminal and a cathode terminal connected by a load current path of a first MOS transistor and a diode that is connected parallel to a load current path. An alternating input voltage is operably applied between the anode terminal and the cathode terminal. Further, the rectifier includes a control circuit that is configured to switch the first MOS transistor on for an on-time period, during which the diode is forward biased. The first MOS transistor, the diode, and the control circuit are integrated in the semiconductor substrate.

36 Claims, 15 Drawing Sheets

(56) References Cited

U.S. PATENT DOCUMENTS

| | | |
|---|---|---|
| 7,906,953 B2 * | 3/2011 | Dikken ............. H02M 3/33584 |
| | | 323/288 |
| 8,013,586 B2 | 9/2011 | Tlaskal et al. |
| 9,240,728 B2 | 1/2016 | Iorio et al. |
| 9,281,680 B2 | 3/2016 | Nakayama |
| 2007/0081371 A1 * | 4/2007 | Wittenbreder, Jr. .... H02M 1/08 |
| | | 363/127 |
| 2010/0244559 A1 | 9/2010 | Goerlach et al. |
| 2011/0057630 A1 | 3/2011 | Saito et al. |
| 2014/0085760 A1 | 3/2014 | Lui |
| 2015/0049529 A1 | 2/2015 | Iorio et al. |
| 2015/0318790 A1 | 11/2015 | Tichy et al. |

OTHER PUBLICATIONS

Response to Office Action dated Sep. 29, 2017, from U.S. Appl. No. 15/379,007, filed Dec. 19, 2017, 12 pp.

U.S. Appl. No. 15/378,867, by Pidutti et al., filed Dec. 14, 2016.

U.S. Appl. No. 15/378,945, by Pidutti et al., filed Dec. 14, 2016.

U.S. Appl. No. 15/379,007, by Pidutti et al., filed Dec. 14, 2016.

U.S. Appl. No. 15/631,767, filed by Damiano Gadler et al., filed Jun. 23, 2017.

U.S. Appl. No. 15/474,669 filed by Damiano Gadler et al., filed Mar. 30, 2017.

* cited by examiner

RECTIFIER DEVICE WITH SAFETY THRESHOLD

TECHNICAL FIELD

The invention relates to the field of power supplies, in particular to rectifier circuits and devices and related methods and devices.

BACKGROUND

In the electric power grid electric electricity is usually distributed to customers in the form of alternating current (AC) for various reasons. Furthermore, alternators are used, for example, in automobiles to generate alternating current. In many applications, alternating current has to be converted into direct current (DC) in order to provide a DC supply for electronic circuits or other devices, which need a DC supply. This conversion process is referred to as rectification. The standard components used to build a rectifier are silicon diodes. Several types of rectifier exists. One common type is a single-phase full-wave rectifier that is usually built using four diodes connected in a bridge configuration (a so-called Graetz bridge). As a side note, it should be mentioned that the alternating voltage provided by the electric power grid (e.g. 120 or 230 volts) is usually transformed to lower voltages using transformers before being rectified. In the automotive sector, alternators usually generate multiple-phase output voltages, and a suitable three-phase full-wave rectifier may, for example, include six diodes. Furthermore, rectifier diodes may also be used, for example, in (DC/DC or AC/DC) switching converters.

Silicon diodes have a forward voltages of approximately 0.6 to 0.7 volts. Schottky- and germanium diodes have slightly lower forward voltages of approximately 0.3 volts. The forward voltage of a pn-junction (i.e. of a diode) depends on the semiconductor material and therefore can be regarded practically as a constant parameter (when disregarding temperature dependency) for a specific semiconductor manufacturing technology, which normally is based on silicon. That is, silicon diodes will always produce (at room temperature) a power dissipation of approximately 600 to 700 milliwatts per ampere load current. A diode bridge (bridge rectifier), which is composed of four diodes, thus produces a power dissipation of approximately 1.2 to 1.4 watts per ampere (RMS) of load current as two diodes are always forward biased in a diode bridge. Particularly for comparably low voltages (e.g. 5 to 15 volts) the power dissipation in the rectifier can be a significant portion of the total generated power.

To reduce power dissipation in rectifier devices, a technique referred to as active rectification may be used. Thereby, silicon diodes are replaced by power transistors such as power MOS field effect transistors (MOSFETs) or power bipolar junction transistors (BJTs), which have a comparably low on-resistance and thus may produce a significantly lower voltage drop as compared to simple silicon diodes. However, usually a relatively complex control circuit is needed to switch the transistor on and off synchronously to the alternating voltage.

SUMMARY

A rectifier device is described herein. In accordance with an exemplary embodiment, the rectifier device includes an anode terminal and a cathode terminal, which are connected by a load current path of a first MOS transistor and a diode connected parallel to the load current path. An alternating input voltage is operably applied between the cathode terminal and the anode terminal. The rectifier device further includes a control circuit. the control circuit includes a control logic that is configured to switch on the first MOS transistor for an on-time period, during which the diode is forward biased. The control circuit further includes a safety circuit that is configured to trigger a switch-off of the first MOS transistor when the input voltage reaches a safety threshold.

In accordance with another exemplary embodiment, the rectifier device includes a semiconductor substrate, a plurality of transistor cells arranged in the semiconductor substrate, and a first MOS transistor composed of at least a portion of the plurality of transistor cells. The first MOS transistor has a load current path and body diode coupled parallel to the load current path. The rectifier device further includes an anode terminal and a cathode terminal connected by the load current path of the first MOS transistor and the body diode. Furthermore, the rectifier device includes a control circuit. The control circuit includes a control logic that is configured to switch on the first MOS transistor upon detection that a voltage between cathode and anode terminal reaches a first threshold voltage. The control logic is further configured to switch off the first MOS transistor upon detection that the voltage between cathode and anode terminal reaches a second threshold voltage, wherein the anode terminal has an electric potential that serves as ground potential for the control circuit, and wherein the first and the second threshold voltages are negative. Moreover, the control circuit includes a safety circuit that is configured to trigger a switch-off of the first MOS transistor when the voltage between cathode and anode terminal reaches a safety threshold, which is a positive threshold voltage.

Furthermore, a method for operating a rectifier device is described herein, wherein the rectifier device includes a MOS transistor and a diode, both coupled in parallel between an anode terminal and a cathode terminal. In one exemplary embodiment the method includes detecting that the diode is forward biased and switching on, by a control circuit, the MOS transistor upon detection that the diode is forward biased. The method further includes detecting, while the diode is forward biased, that the voltage across the rectifier device between the cathode terminal and the anode terminal reaches a specific threshold voltage and switching off the MOS transistor upon detection that the voltage across the rectifier device has reached the specific threshold value. Furthermore, the method includes detecting that a voltage between cathode and anode terminal rises above a safety threshold and switch-off, by the control circuit, the MOS transistor upon detection that the safety threshold has been hit.

In accordance with a further example a rectifier device includes an anode terminal and a cathode terminal connected by a load current path of a first MOS transistor and a diode connected parallel to the load current path. An alternating input voltage is operably applied between the anode terminal and the cathode terminal. The electrical potential at the anode terminal serves as reference potential rectifier device; and a control circuit includes: control logic that is configured to switch on the first MOS transistor for an on-time period, during which the diode is forward biased; and a safety circuit that is configured to trigger a switch-off of the first MOS transistor when the input voltage reaches a safety threshold. Thereby, the control circuit includes at least one comparator circuit configured to compare the voltage at the cathode terminal with at least one threshold voltage, and the comparator receives, as a first input signal, a level-shifted and scaled representation of the voltage at the cathode terminal, and uses, as a second input signal, a level shifted and a scaled version of the threshold voltage

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings:

FIG. 2 illustrates a power MOSFET which can be used to replace a diode in a rectifier circuit, wherein, in the embodiments described herein, the power MOSFET is reverse conducting when switched on.

DETAILED DESCRIPTION

Figure 1:
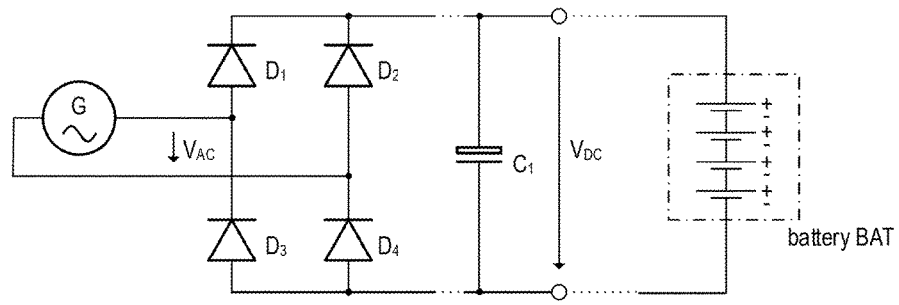
FIG. 1 illustrates, as an illustrative example, a single-phase full-wave rectifier circuit composed of four diodes.

As mentioned above, several types of rectifiers exists. FIG. 1 shows, as an illustrative example, a single-phase full-wave rectifier, which is built using four diodes $D_1$, $D_2$, $D_3$, $D_4$ connected in a bridge configuration (a so-called Graetz bridge or bridge rectifier). FIG. 1 also shows an AC voltage source G, which may represent, for example, the electric grid, the secondary side of a transformer, an AC generator such as an alternator used in an automobile, or any other common AC voltage source. The voltage source G provides an alternating voltage $V_{AC}$ supplied to the bridge rectifier. A capacitor $C_1$ may be connected to the output of the bridge rectifier to reduce the ripple of the DC output voltage $V_{DC}$. In the example of FIG. 1, an automotive battery BAT is coupled to the bridge rectifier so that the battery can be charged by the generator G. Silicon diodes usually have a forward voltage of approximately 0.6 to 0.7 volts, and therefore may cause significant power dissipation. To reduce the power dissipation, a silicon diode may be replaced by a rectifier device including a controllable semiconductor switch. In the example illustrated in FIG. 2, the rectifier device 10 includes a power MOS transistor $M_P$, which has an intrinsic diode $D_R$ (body diode) coupled in parallel to the load current path (drain-source current path) of the power MOS transistor $M_P$. Anode and cathode of the rectifier device 10 correspond to anode and cathode of the intrinsic diode and are labelled A and K, respectively. In the examples described herein, the power MOS transistor is a MOSFET with the intrinsic diode being the MOSFETs body diode. In this context, however, an IGBT (which is also switched on and off by a MOS gate) may also be regarded as a MOS transistor, wherein the IGBT may have a reverse diode integrated in the same semiconductor die as the IGBT.

Unlike in known active rectifier circuits (also referred to as "synchronous rectifiers"), the MOSFET $M_P$ is operated in a reverse conducting mode. In essence, a standard rectifier diode (as used for example in the bridge rectifier of FIG. 1) is replaced by the body diode of a power MOSFET, which can be bypassed by the MOS channel of the MOSFET, when the MOSFET is switched on. That is, the MOSFET is switched on (which makes the MOS channel conductive), when the body diode is forward biased, thus bypassing the current path through the body diode. When the diode $D_R$ is reverse biased the MOSFET $M_P$ is always off. In the example depicted in FIG. 2, the rectifier device 10 has only two terminals, a first terminal A (anode terminal, connected to the anode of the body diode $D_R$) and a second terminal K (cathode terminal, connected to the cathode of the body diode $D_R$). As will be explained later, the control circuit used for switching the MOSFET $M_P$ on and off may be integrated in the same semiconductor die as the MOSFET $M_P$, and the internal supply of the integrated control circuit may be internally generated from the AC voltage applied at the two terminals A and K.

Figure 2:
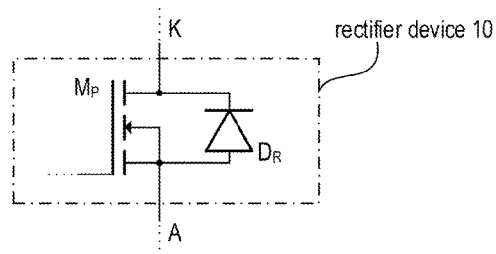
Figure 3:
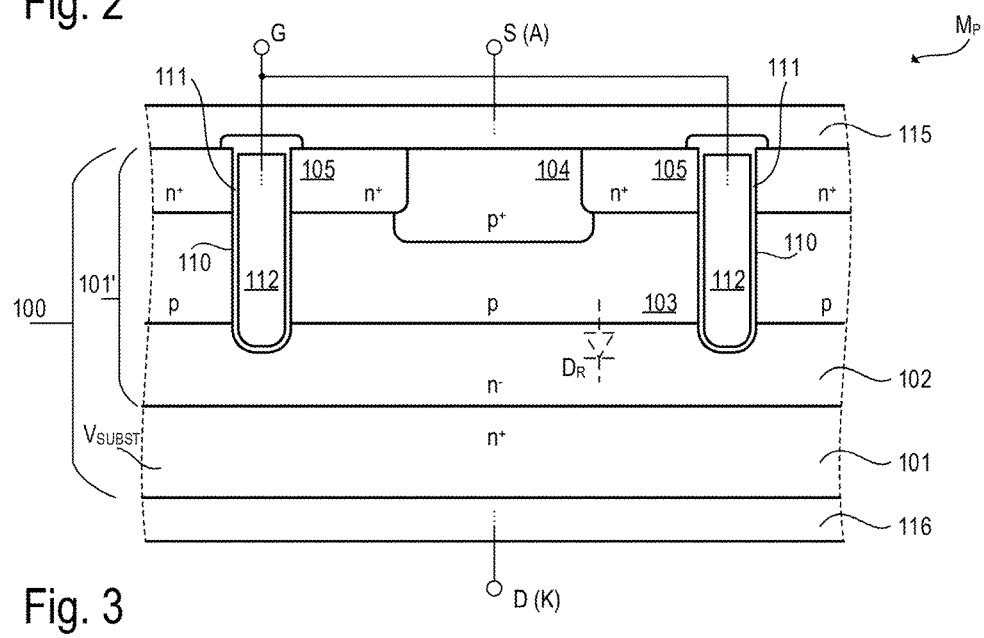
FIG. 3 is a cross-sectional view of a semiconductor body illustrating exemplary implementation of the power MOSFET of FIG. 2.

FIG. 3 illustrates one exemplary implementation of the power MOSFET $M_P$ of FIG. 2 in a silicon substrate. In the present example, the MOSFET is implemented using a vertical transistor structure composed of a plurality of transistors cells. The term "vertical" is commonly used in the context of power transistors and refers to the direction of the load current path (MOS channel), which extends vertically with respect to a horizontal plane defined by the bottom plane of the semiconductor substrate. The term "vertical" can thus be used to discriminate vertical transistors from planar transistors, in which the load current path (MOS channel) extends parallel to the horizontal plane. In the present example, the vertical MOS transistor is implemented as a so-called trench transistor, which has its gate electrodes arranged in trenches formed in the silicon body. However, other types of vertical power transistors or other types of transistors may be used.

In the example of FIG. 3, the semiconductor body 100 is essentially formed by a semiconductor substrate 101 (wafer), on which a (e.g. monocrystalline) semiconductor layer 101' is deposited using epitaxial growth. The semiconductor substrate 101 and the semiconductor layer 101' may be doped with dopants of a first doping type, e.g. n-type dopants, wherein the concentration of dopants may be much lower in the semiconductor layer 101' (therefore labelled $n^-$) as compared to the highly doped substrate 101 (labelled $n^+$). Trenches 110 are formed in the semiconductor layer by an anisotropic etching process. The trenches 110 extend—from the top surface of the semiconductor body 100—vertically into the semiconductor body 100 and are filled with conductive material (e.g. highly doped polycrystalline silicon) to form gate electrodes 112 within the trenches 110. The gate electrodes 112 are isolated from the surrounding semiconductor body 100 by an oxide layer 111, which is disposed on the inner surfaces of the trenches 110 before filling them with the mentioned conductive material.

An upper portion of the semiconductor layer 101' is doped with dopants of a second doping type, e.g. p-type dopants, e.g. using a first doping process (e.g. diffusion process of dopants or ion implantation). The resulting p-doped region is usually referred to as body region 103, whereas the remaining n-doped portion of the semiconductor layer 101' (directly adjoining the substrate 101) forms the so-called drift region 102 of the MOS transistor. As the trenches 110 extend down to the drift region 102, the body region 102 is segmented into a plurality in body regions associated with a respective plurality of transistor cells.

A second doping process (e.g. diffusion process of dopants or ion implantation) is used to form source regions 105. Therefore, the MOSFET $M_P$ is also referred to as DMOS (double-diffused metal-oxide-semiconductor) transistor. The source regions are doped with dopants of the same type as the substrate 101 (e.g. n-type dopants). The concentration of dopants may be comparably high (therefore labelled $n^+$), but is not necessarily equal to the concentration of dopants in the substrate 101. The source regions 105 extend vertically into the semiconductor body starting from the top surface of the semiconductor body and adjoining the trenches 112. Body contact regions 104, which are doped with dopants of the same type as the body regions 103, may be formed between neighboring trenches 110 in order to allow to electrically contact the body regions 103 at the top surface of the semiconductor body 100. The source regions 105 and the body contact regions 104 are electrically contacted at the top surface of the semiconductor body 100 by the conductive layer 115 (e.g. metal layer) that forms the source electrode S of the power MOSFET (DMOS transistor). Thereby the individual transistors cells are electrically connected in parallel. The gate electrodes 112 in the trenches 10 have to be isolated from the conductive layer 115 and are also connected to each other, e.g. at the end of the trenches 110 (not visible in FIG. 3). The drain electrode D is formed by another conductive layer 116 at the bottom surface of the semiconductor body 100.

The body diode $D_R$ (see also FIG. 3) of the MOSFET is also shown in the cross-sectional view of FIG. 3. It is formed by the p-n junctions at the transition between the body regions 103 (in each transistor cell) and the drift region 102. The source electrode S (which is electrically connected to the source and body contact regions) is therefore also the anode of the diode $D_R$, and the drain electrode D is also the cathode of the diode $D_R$. A transistor designed according to the example of FIG. 3 or similar transistor designs are as such known (sometimes referred to as DMOS transistor) and thus not further explained in more detail.

Figure 4:
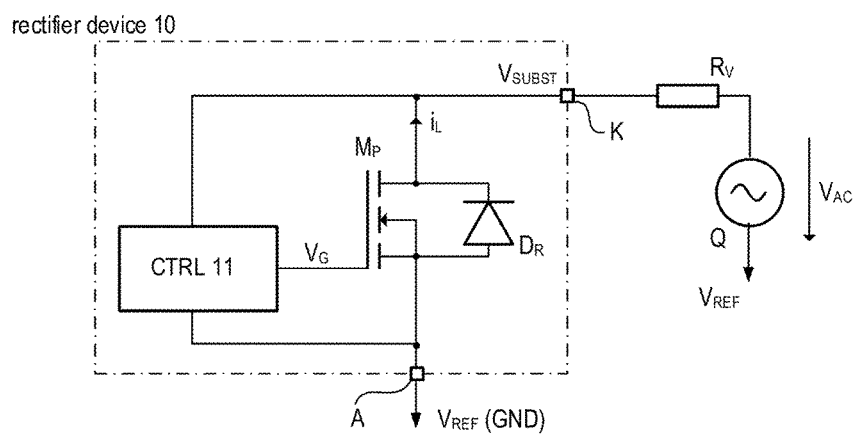
FIG. 4 is a circuit diagram illustrating the power MOSFET of FIG. 2 and a control circuit that is configured to actively switch the MOSFET on when the body diode becomes forward biased.

What should be mentioned at this point is that the MOS transistor $M_P$ is not the only component integrated in the substrate. All other circuitry needed for controlling the switching operation of the MOS transistor $M_P$ is also integrated in the same semiconductor body 100. The embodiments described herein may be designed as two-terminal rectifier devices (anode or reference terminal A and cathode or substrate terminal K), which have only two external pins and behave essentially like diodes. Unlike a normal diode, the rectifier devices described herein may be designed to have a very low forward voltage as the low-resistive MOS channel bypasses the current path through the body diode $D_R$ while the body diode is forward biased. In the following, the potential at the first terminal A (anode terminal, corresponds to the source electrode of the power MOSFET $M_P$) is denoted as reference voltage $V_{REF}$, whereas the voltage at the second terminal K (cathode terminal, corresponds to the drain electrode of the power MOSFET $M_P$) is denoted as substrate voltage $V_{SUBST}$ (voltage present in the substrate 101, see FIG. 3). FIG. 4 illustrates the rectifier device 10 of FIG. 2 in more detail. Accordingly, the rectifier device includes the MOSFET/DMOS transistor $M_P$ (include the intrinsic reverse diode $D_R$, see FIG. 2) and a control circuit 11 connected to a gate terminal of the MOSFET $M_P$. As explained above, the MOSFET $M_P$ and its intrinsic body diode $D_R$—and also the control circuit 11—are connected between the first and the second terminals A and K, respectively. The electric potential $V_{REF}$ at the first terminal (anode) can be defined as zero volts (0 V) and can thus be regarded as reference or ground potential for all circuitry integrated in the semiconductor body 100. With respect to the reference potential $V_{REF}$, the substrate voltage $V_{SUBST}$ may vary from negative values of (at room temperature) approximately −0.7 volts minimum (i.e. the negative forward voltage of the body diode $D_R$) to a positive peak value $V_{AC\_MAX}$ of an alternating input voltage $V_{AC}$ applied between the two terminals A and K. In the example of FIG. 4, the rectifier device 10 is supplied by an AC source Q via a resistor $R_V$. Supplying the rectifier device 10 has to be regarded as a merely hypothetical example, which is used to explain the function of the rectifier device.

Figure 5:
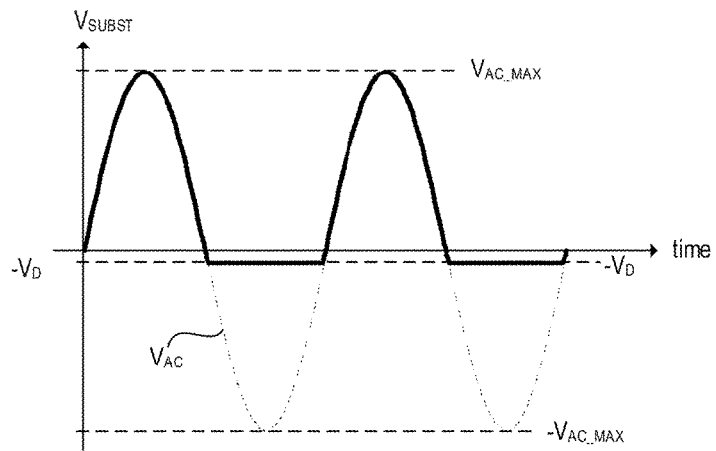
FIG. 5 is a timing diagram illustrating the voltage across the body diode of the MOSFET of FIG. 4, when the MOSFET is connected to a load and not actively switched on while being supplied with an alternating voltage.

FIG. 5 is a timing diagram illustrating the waveform of the substrate voltage $V_{SUBST}$ with respect to the reference potential $V_{REF}$ for the hypothetic case, in which the MOSFET $M_P$ included in the rectifier device 10 is never switched on and, therefore, the load current $i_L$ can only pass the rectifier device 10 via the body diode $D_R$. In this example it is further assumed that an alternating input voltage $V_{AC}$ is applied to a series circuit of the rectifier device 10 and a load (see FIG. 4, resistor $R_V$). Without loss of generality, the reference potential $V_{REF}$ may be defined as 0 V. While the body diode $D_R$ is reverse biased ($V_{SUBST}$>0 V), the substrate voltage $V_{SUBST}$ follows the alternating input voltage $V_{AC}$ and the load current is approximately zero (diode $D_R$ is blocking). While the body diode $D_R$ is forward biased ($V_{SUBST}$<0V), the substrate voltage $V_{SUBST}$ follows the alternating input voltage $V_{AC}$ as long as the alternating input voltage $V_{AC}$ is higher than the negative forward voltage $-V_D$ of the body diode $D_R$ (e.g. $V_{AC}$>−0.6V). However, when the alternating input voltage $V_{AC}$ becomes lower than the negative forward voltage $-V_D$ of the body diode $D_R$ (e.g., $V_{AC}$<−0.6V), the substrate voltage will be approximately limited to the negative forward voltage $-V_D$ of the body diode $D_R$ (e.g., $V_{SUBST}$≈−0.6V), the diode $D_R$ is conductive, and the difference between the (negative) substrate voltage and the alternating input voltage $V_{AC}$ is the voltage drop across the load. The load current it, actually passing through the rectifier device 10 (while $V_{AC}$<−$V_D$) depends on the load.

As mentioned above, a voltage drop across the rectifier device 10 of approximately 600 to 700 mV (at room temperature) may cause a significant power dissipation. To reduce the substrate voltage $V_{SUBST}$ while the body diode $D_R$ is forward biased, the MOS transistor $M_P$ can be switched on to make the MOS channel of the MOS transistor $M_P$ conductive. In this case, the body diode D is bypassed via the low-ohmic current path provided by the MOS channel. However, in the time period, in which the body diode $D_R$ is reverse biased (i.e. blocking), the MOS transistor should remain switched off. The logic circuit controlling the switching operation of the MOS transistor $M_P$ is included in the control circuit 11 (see FIG. 4).

As shown in FIG. 4, the control circuit 11 is coupled between the two terminals A and K, at which the alternating input voltage is applied (see FIG. 5). However, some circuit components in the control circuit 11 need a DC supply voltage in order to operate properly. Therefore, the control circuit 11 includes at least one supply circuit, which provides an internal supply voltage $V_S$ for supplying various other circuit components of the control circuit 11. Before explaining exemplary implementations of the control circuit 11 and its function in more detail, two exemplary implementations of supply circuits are explained with reference to FIGS. 6A and 6B.

Figure 6A:
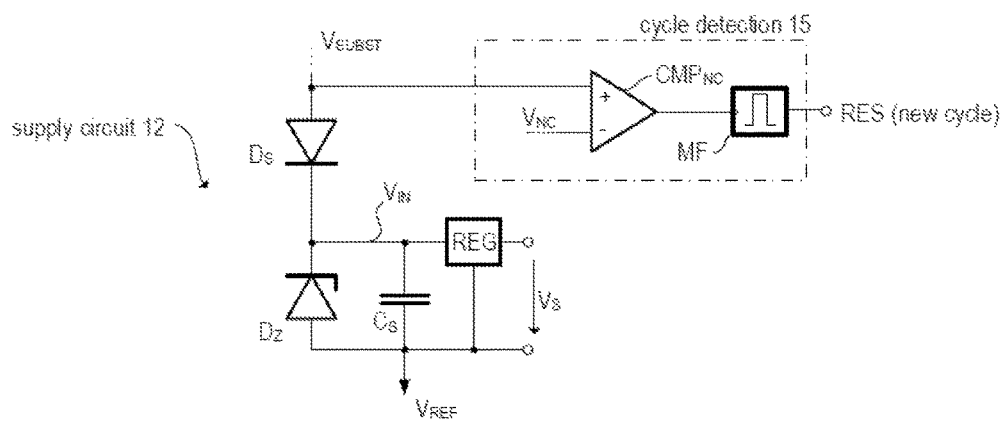
FIG. 6A is a circuit diagram illustrating an exemplary supply circuit, which may be included in the control circuit to supply the control logic used to switch the MOSFET of FIG. 4 on and off.
Figure 6B:
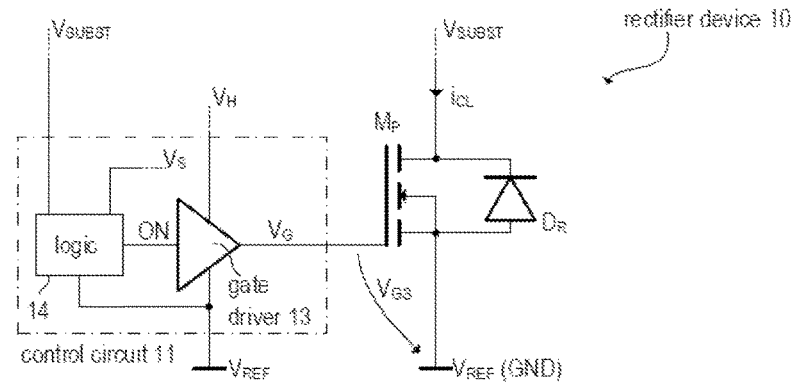
FIG. 6B is a circuit diagram illustrating the control circuit of FIG. 4 in more detail.

The exemplary supply circuit 12 illustrated in FIG. 6A is coupled between the first (anode) terminal A (reference potential $V_{REF}$) and the second (cathode) terminal K (substrate voltage $V_{SUBST}$), which are connected to the source and drain of the MOSFET $M_P$, respectively. A series circuit composed of a diode $D_S$ and a Zener diode $D_Z$ is electrically connected between the substrate (being at substrate voltage $V_{SUBST}$) and the source electrode of the MOSFET $M_P$ (being at reference potential $V_{REF}$). A buffer capacitor $C_S$ is connected parallel to the Zener diode $D_Z$ as shown in FIGS. 6A and 6B. The capacitor $C_S$ is charged via the diode $D_S$ when the level of the substrate voltage $V_{SUBST}$ is higher than the sum of the voltage $V_{IN}$ across the capacitor $C_S$ and the forward voltage of the diode $D_S$. The Zener diode $D_Z$ limits the capacitor voltage $V_{IN}$ across the capacitor $C_S$ to a maximum value, which is determined by the Zener voltage of the Zener diode $D_Z$. Furthermore, the diode $D_S$ prevents the discharging of the capacitor $C_S$ via the substrate when the substrate voltage $V_{SUBST}$ falls to values lower than the capacitor voltage $V_{IN}$. The capacitor voltage $V_{IN}$ may be supplied as input voltage to a voltage regulator device REG, and the input voltage $V_{IN}$ is buffered by the capacitor $C_S$ while the substrate voltage $V_{SUBST}$ is low. The regulated output voltage of the voltage regulator REG is denoted as $V_S$. The regulated output voltage $V_S$ may be regarded as internal supply voltage that is used to supply any circuitry (such as logic circuits) integrated in the rectifier device 10.

Also shown in FIG. 6A but not part of the supply circuit 12 is a cycle detection circuit 15 that essentially includes a comparator $CMP_{NC}$, which is configured to signal at its output a new cycle of the substrate voltage $V_{SUBST}$. The comparator $CMP_{NC}$ may be supplied by the internal supply voltage $V_S$. In the present example, the comparator compares the substrate voltage $V_{SUBST}$ with the threshold voltage $V_{NC}$, which may be equal to the reference voltage $V_{REF}$ or may be a small positive value in the range of a few millivolts. The threshold voltage $V_{NC}$ is applied to the inverting input of the comparator $CMP_{NC}$ and the substrate voltage $V_{SUBST}$ is applied to the non-inverting input of the comparator $CMP_{NC}$. Thus, the comparator $CMP_{NC}$ generates a rising edge at its output when the substrate voltage $V_{SUBST}$ rises above the threshold voltage $V_{NC}$. This rising edge may trigger a mono-flop MF, which is connected to the output of the comparator $CMP_{NC}$ and generates a reset pulse of a defined pulse length in each cycle of the alternating substrate voltage $V_{SUBST}$.

It is noted, that the circuit of FIG. 6A has to be regarded as an illustrative example and may also be implemented in various alternative ways. For example, the Zener diode $D_Z$ may be replaced by a any clamping circuit configured to limit the capacitor voltage to a desired maximum. Dependent on the application the Zener diode may be omitted. The capacitor $C_S$ may be replaced by any circuit (e.g. series or parallel circuit of several capacitors) providing a sufficient capacitance to be able to buffer the input voltage $V_{IN}$ while the substrate voltage is too low to charge the capacitor $C_S$. In some implementations, the voltage regulator REG may be substituted by other circuitry that provides a similar function. If the capacitance of the capacitor $C_S$ is high enough to ensure an acceptably low ripple, the regulator REG may be also omitted. As mentioned, various modifications and enhancements of the basic example of FIGS. 6A and 6B may be considered. For example, a source follower may be connected between the cathode of diode $D_S$ and the voltage regulator REG, wherein the gate of the source follower is connected to a substantially constant voltage (e.g. generated using a Zener diode). This would limit the capacitor voltage to a desired maximum and reduce current consumption.

The circuit shown in FIG. 6B illustrates the control circuit 11 (see FIG. 4), which is used in the rectifier device 10 to control the operation of the power MOS transistor $M_P$, in more detail. Accordingly, the control circuit includes control logic 14 which is configured to generate a control signal ON that determines the switching state (on/off) of the power MOS transistor $M_P$. The control signal ON may be a binary signal which can only assume either a high level or a low level. A gate driver 13 may be included in the control circuit 11; the gate driver circuit may be configured to convert the binary control signal ON in a gate voltage $V_G$ that is suitable to switch the power MOS transistor $M_P$ on and off when applied to the transistor's gate electrode. The control logic 14 may be supplied by the internal supply voltage $V_S$, which may be provided, for example, by the supply circuit 12 shown in FIG. 6A. The supply circuit 12 may also be included in the control circuit 11. As shown in FIG. 6B, the gate driver 13 may be supplied by a separate voltage $V_H$ that may be, for example, buffered by a capacitor (not shown, similar to capacitor $C_S$ in FIG. 6A). Dependent on the implementation, the gate driver 13 may also be supplied by the internal supply voltage $V_S$.

Figure 7A:
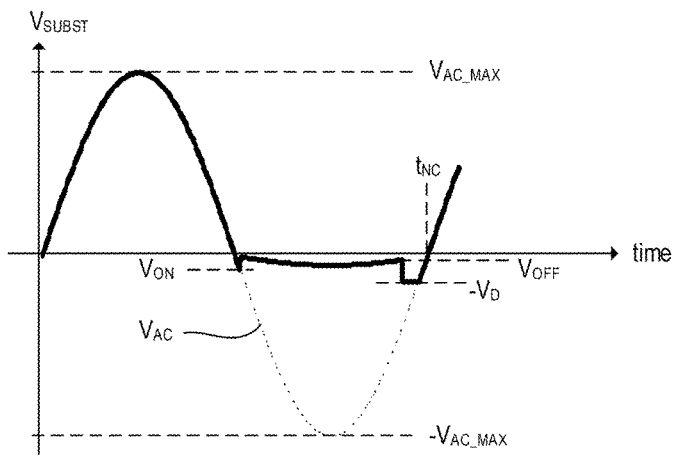
FIGS. 7A and 7B are timing diagrams illustrating the switching of the MOSFET of FIG. 4, when supplied with an alternating voltage.
Figure 7B:
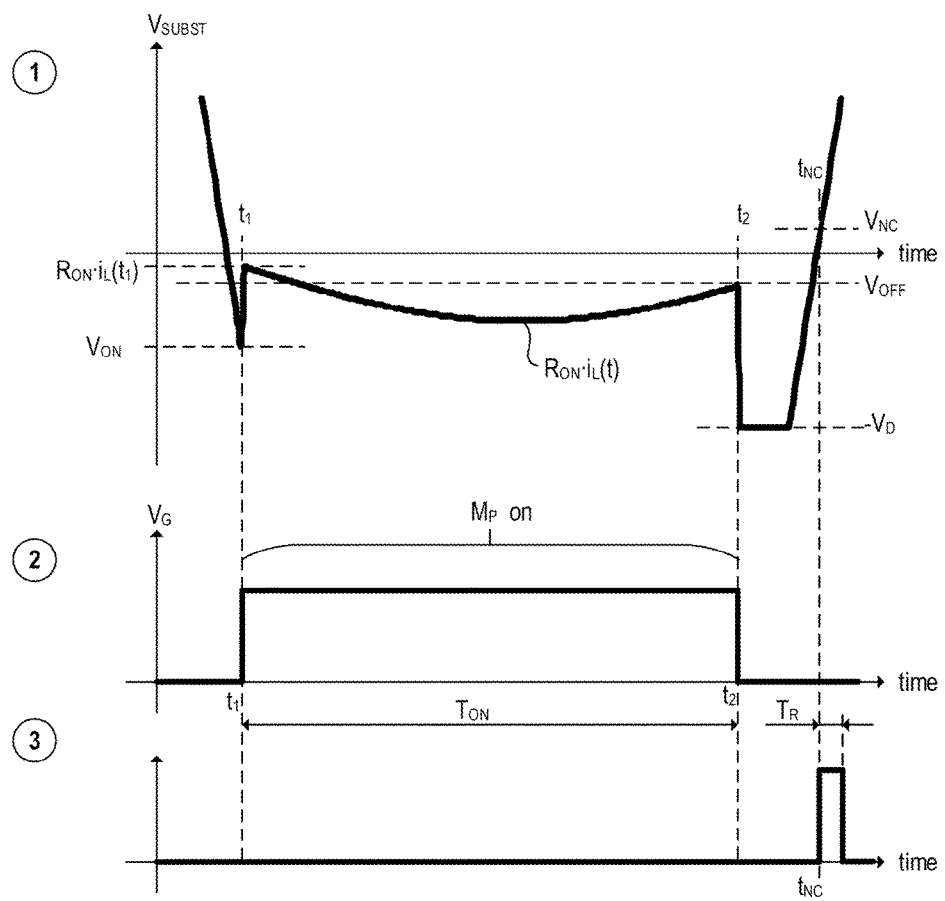

FIG. 7A is a timing diagram illustrating the function of one exemplary embodiment of the rectifier device implemented according to the basic example of FIG. 4. In particular, the switching on and switching off of the MOS transistor $M_P$ is illustrated. The diagram of FIG. 7A is essentially the same as the diagram of FIG. 5 except that, in the current example, power MOS transistor $M_P$ is switched on, when the intrinsic body diode $D_R$ is forward biased in order to bypass the body diode via the activated MOS channel. The bypassing of the body diode $D_R$ results in a voltage drop across the rectifier device 10, which is significantly lower than the forward voltage of a normal diode. The first diagram of FIG. 7B illustrates a magnified detail of the waveform shown in FIG. 7A. FIG. 7A shows a full cycle of the substrate voltage $V_{SUBST}$, whereas the first diagram of FIG. 7B only shows approximately the second half of the cycle, during which the substrate voltage $V_{SUBST}$ is negative. The second diagram illustrates a simplified waveform of the gate voltage applied to the MOS transistor $M_P$ to switch it on and off. The third diagram of FIG. 7B illustrates the reset signal RES including the reset pulses, which may be generated by the cycle detection circuit 15 shown in FIG. 6A. As can be seen in FIGS. 7A and 7B, the MOS transistor $M_P$ is switched on, when the control circuit 11 detects that the substrate voltage $V_{SUBST}$ is negative (i.e. the diode $D_R$ is forward biased). To determine the time instants for switching the MOS transistor $M_P$ on and off (i.e. begin and end of the on-time period $T_{ON}$ of MOS transistor $M_P$) negative threshold voltages $V_{ON}$ and $V_{OFF}$ may be used as explained below. Accordingly, the MOS transistor $M_P$ is switched on, when the substrate voltage $V_{SUBST}$ reaches or falls below the first threshold $V_{ON}$. In the present example, the condition $V_{SUBST}=V_{ON}$ is fulfilled at time $t_1$ and the gate voltage $V_G$ (see second diagram of FIG. 7B) is set to a high level to switch the MOS transistor $M_P$ on. When the substrate voltage $V_{SUBST}$ reaches or exceeds the second threshold $V_{OFF}$ at the end of a cycle, the MOS transistor $M_P$ is switched off again. In the present example, the condition $V_{SUBST}=V_{OFF}$ is fulfilled at time $t_2$ and the gate voltage $V_G$ (see bottom diagram of FIG. 7B) is set to a low level to switch the MOS transistor $M_P$ off. When the MOS transistor $M_P$ is switched off at time $t_2$, the substrate voltage $V_{SUBST}$ may abruptly fall to $-V_D$ before it again rises to positive values at the beginning of the next cycle (reset pulse at time instant $t_{NC}$).

While the MOS transistor $M_P$ is switched on, the substrate voltage $V_{SUBST}$ equals $R_{ON} \cdot i_L$, wherein $R_{ON}$ is the on-resistance of the activated MOS channel. In the present example only two threshold values are used to switch the MOS transistor $M_P$ on and off, respectively. However, two or more threshold values may be used for the switch-on and/or the switch-off. In this case the power MOSFET is switched on/off gradually by subsequently switching on/off two or more groups of transistor cells of the power MOSFET. A more detailed example of a rectifier device, in which the power MOSFET is switched off in two steps is explained later with regard to FIG. 12.

Referring back to FIG. 7A, both, the first threshold $V_{ON}$ and the second threshold $V_{OFF}$ are negative (note that the reference voltage $V_{REF}$ is defined as zero), but higher than the negative forward voltage $-V_D$ of the body diode $D_R$ of the MOS transistor $M_P$. Furthermore, the second threshold $V_{OFF}$ is higher than the first threshold $V_{ON}$. That is, the condition $-V_D<V_{ON}<V_{OFF}<0$ is fulfilled in the present example, e.g. $V_{ON}=-250$ mV and $V_{OFF}=-50$ mV, while $-V_D=-600$ mV. As can be seen in FIG. 7B, the MOS transistor should only switch on once in each cycle when the condition $V_{SUBST}=V_{ON}$ is met for the first time. When the condition is met again in the same cycle, a second switch-on of the MOS transistor $M_P$ should be prevented (e.g. at time instant $t_2$, see first diagram of FIG. 7A). Similarly, the MOS transistor $M_P$ should be switched off when the condition $V_{SUBST}=V_{OFF}$ is me at the end of a cycle. If this condition is met earlier during a cycle (e.g. shortly after time $t_1$, if $R_{ON} \cdot i_L(t_1) > V_{OFF}$), an early switch-off of the MOS transistor should be prevented. In order to avoid an undesired early switch-off of the MOS transistor, the control circuit may include a timer that prevents a switch-off for a specific time span. One exemplary implementation of control logic, which may be included the control circuit 11, is described below with reference to FIG. 8.

Figure 8:
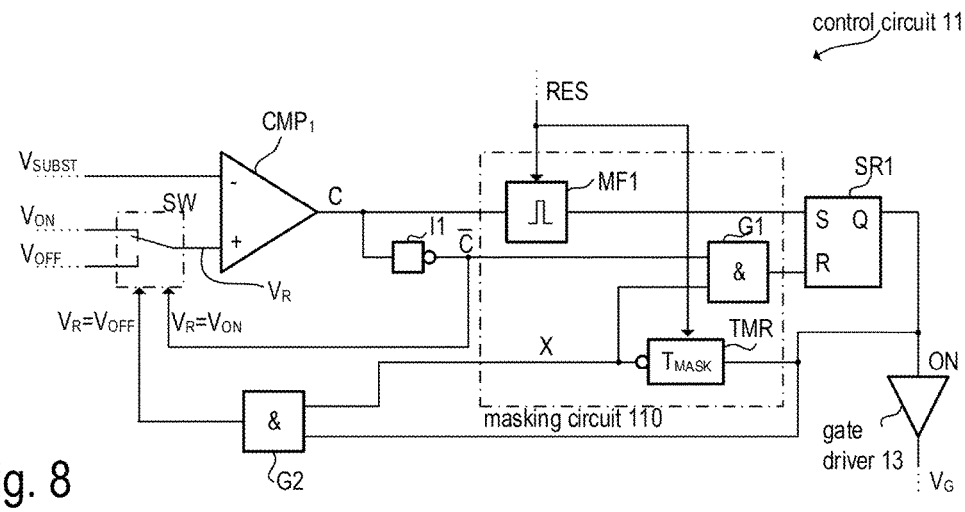
FIG. 8 is a block diagram illustrating one exemplary control logic for switching the MOSFET of FIG. 4 on and off as shown in the timing diagram of FIGS. 7A and 7B.

FIG. 8 is a block diagram illustrating one exemplary implementation of a control logic for the control circuit 11 (see FIG. 4) which is designed to switch the MOS transistor $M_P$ on and off as illustrated in the timing diagrams of FIGS. 7A and 7B. Various circuit components used in the circuit of FIG. 8 may be supplied by a supply circuit 12 as shown, for example, in FIG. 6A (internal supply voltage $V_S$). In the present example, the control logic includes a comparator $CMP_1$ that receives the substrate voltage $V_{SUBST}$ at a first input (e.g. inverting input) and a threshold voltage $V_R$ at a second input (e.g. non-inverting input). The substrate voltage $V_{SUBST}$ and the threshold voltage $V_R$ are compared by the comparator $CMP_1$, which generates a binary comparator output signal C (high/low logic signal). An inverter I1 is connected to the comparator output and generates an inverted comparator output signal $\overline{C}$. A level transition (dependent on the implementation from a low level to a high level or vice versa) occurs in the comparator output signal C when the substrate voltage $V_{SUBST}$ reaches the threshold voltage $V_R$. In the present example, the comparator $CMP_1$ generates a high level when the substrate voltage $V_{SUBST}$ is below the threshold voltage $V_R$.

To implement the switching scheme shown in FIG. 7B, the threshold voltage $V_R$ may be switched from a first value $V_{ON}$ to a second value $V_{OFF}$ (and vice versa) using, for example, an electronic switch SW. In the present example, the electronic switch SW is configured to apply either the first threshold voltage $V_{ON}$ or the second voltage $V_{OFF}$ (as reference voltage $V_R$) to the second comparator input. The comparator output is coupled to the set and reset inputs of a SR flip-flop SR1 via a masking circuit 110. The masking circuit 110 is designed to prevent a multiple switch-on and an undesired early switch-off of the power MOSFET $M_P$. The SR flip-flop SR1 is activated, when the comparator output signal C indicates (e.g., by a specific level or a level transition) that the substrate voltage $V_{SUBST}$ has reached the threshold voltage $V_R=V_{ON}$. The SR flip-flop SR1 is reset, when the comparator output signal C indicates that the substrate voltage $V_{SUBST}$ has reached the threshold voltage $V_R=V_{OFF}$, wherein the reference voltage $V_R$ is changed from $V_{ON}$ to $V_{OFF}$ some time after the SR flip-flop SR1 has been activated and changed back from $V_{OFF}$ to $V_{ON}$ when the SR flip-flop SR1 is deactivated. The output signal ON of the SR flip-flop SR1 signals the switch-on and switch-off of the MOS transistor $M_P$ (e.g. via a gate diver circuit 13). In the present example, the MOS transistor $M_P$ is switched on when the output signal ON of the SR flip-flop SR1 is set to a high level, and the MOS transistor $M_P$ is switched off when the output signal ON of SR flip-flop SR1 is reset to a low level (see also FIG. 7B).

As mentioned, the masking circuit 110, which is connected between the comparator $CMP_1$ and the SR flip-flop SR1, is provided to avoid a multiple switch-on of the power MOS transistor $M_P$ as well as an early switch-off during a cycle of the substrate voltage $V_{SUBST}$. To ensure that the SR flip-flop SR1 is only set once in each cycle of the substrate voltage $V_{SUBST}$ the masking circuit 110 includes an edge-triggered monoflop MF1, which is also referred to as "one-shot". The monoflop MF1 is configured to generate a single pulse at its output in response to a s15 rising edge in the comparator output signal C, which is applied to the input of the monoflop MF1. Once an output pulse (a "shot") has been generated by the monoflop MF1 to set the SR flip-flop SR1, no further output pulses can be generated before reset of the monoflop MF1, e.g. by reset signal RES. The reset signal RES may be provided by the supply circuit shown in FIG. 6A or any other circuit configured to detect the start of a new cycle of the substrate voltage $V_{SUBST}$. In essence, the output of the monoflop MF1 (and thus the set-input (S) of the SR flip-flop SR1) is masked for the rest of the cycle of the substrate voltage $V_{SUBST}$ once a set pulse has been generated for the SR flip-flop SR1.

Furthermore, the masking circuit 110 includes a timer circuit TMR that may be coupled between the output (Q) of the SR flip-flop SR1 and (e.g. via a gate circuit G1) the reset input (R) of the SR latch FL2. The timer circuit TMR is triggered by the output signal ON of SR flip-flop SR1 and generates an output signal (masking signal X) that has a high-level except for a defined time span $T_{MASK}$ directly after the SR flip-flop SR1 has been set. That is, the masking signal exhibits a low-level during the time span $T_{MASK}$. While signal X is low, any reset signal (provided by inverter I1) for resetting the SR flip-flop SR1 (and thus for switching-off the MOS transistor $M_P$) is masked. The SR flip-flop SR1 can be reset by a reset pulse in the inverted comparator output signal $\overline{C}$ which is supplied to the reset input (R) of the SR flip-flop SR1 via AND gate G1, which blanks the signal $\overline{C}$ while the masking signal X (supplied to a first input of the AND gate G1) is at a low-level. In other words, the inverted comparator output signal $\overline{C}$, which is applied to the second input of AND-gate G1, cannot pass from the second input to the output of the AND-gate G1 during the time span $T_{MASK}$, because the masking signal X forces the output of the AND-gate G1 to a low level.

The timer circuit TMR may also trigger the switch-over from the reference voltage $V_R = V_{ON}$ to $V_R = V_{OFF}$, which is used by the comparator $CMP_1$. Basically, the switch-over is triggered upon activation of the SR flip-flop SR1, which is indicated by signal ON. However, the switch-over is delayed by a time $T_{MASK}$. Accordingly, the signal X may be combined with the output signal ON using AND-gate G2. Thus, the switch-over from $V_R = V_{ON}$ to $V_R = V_{OFF}$ is triggered by the output of AND-gate G2. In the present example, the switch-over from $V_R = V_{OFF}$ back to $V_R = V_{ON}$ may be triggered by the reset signal $\overline{C}$.

Figure 9:
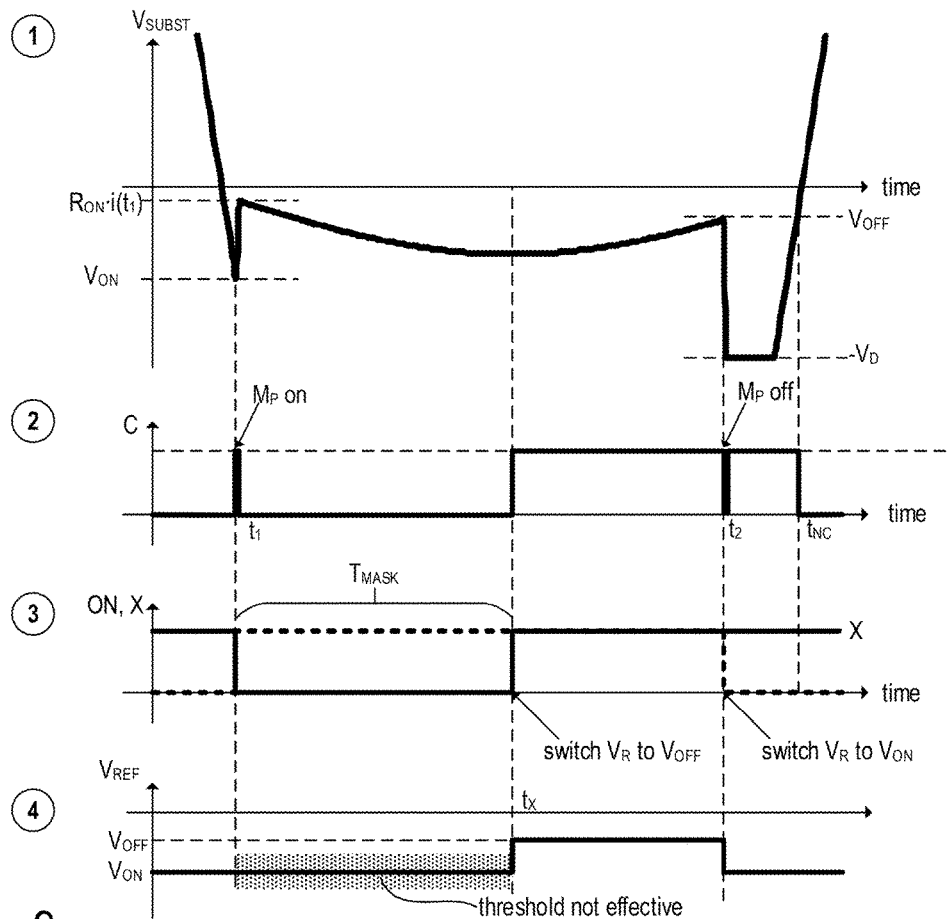
FIG. 9 includes four timing diagrams illustrating the function of the control logic of FIG. 8 in more detail.

The function of the exemplary control logic of FIG. 8 is further explained below with reference to the timing diagrams shown in FIG. 9. The first timing diagram of FIG. 1 is essentially the same as the top diagram of FIG. 7B and shows the second portion of a cycle, during which the substrate voltage $V_{SUBST}$ is negative. When the substrate voltage $V_{SUBST}$ becomes negative, it keeps falling until it reaches the comparator threshold voltage $V_R = V_{ON}$ at time instant $t_1$ (see first diagram of FIG. 9). At this time instant $t_1$ the comparator output of comparator $CMP_1$ (see FIG. 8) rises to a high level thus triggering the one-shot monoflop MF1, which generates a pulse to set the SR flip-flop SR1. The output signal ON of SR flip-flop SR1 is shown in the third diagram of FIG. 9 as dotted line. Upon activation of SR flip-flop SR1 the MOS channel of the transistor $M_P$ is activated via gate driver 13. As soon as the MOS channel is conductive, the substrate voltage $V_{SUBST}$ rises close to zero volts, i.e. to $R_{ON} \cdot i(t_1)$, wherein $i(t_1)$ is the load current at time $t_1$ an $R_{ON}$ the on-resistance of the MOS channel. The product $R_{ON} \cdot i(t_1)$ may be in the range of approximately 100 mV. Dependent on the implementation of the MOS transistor $M_P$, the load current, and the temperature this value may be lower or higher. As the substrate voltage $V_{SUBST}$ rises after to the comparator output signal C again drops to a low level (see second diagram in FIG. 9), so that only a short pulse occurs at the comparator output at time to.

As mentioned above with regard to FIG. 8, the timer circuit TMR is triggered at time instant $t_1$ and outputs a masking signal X, which is at a low-level for a time span $T_{MASK}$ after time instant $t_1$ (until $t_X = t_1 + T_{MASK}$). At time $t_X$ the masking signal X (see third diagram of FIG. 9, solid line) rises again to a high level, and the output signal of gate G2 (logic conjunction X AND ON) is used to trigger the switch-over from the threshold voltage $V_R = V_{ON}$ to $V_R = V_{OFF}$, which is used by the comparator $CMP_1$. However, due to the masking the threshold $V_{OFF}$ is not effective during the time span $T_{MASK}$, and the substrate voltage $V_{SUBST}$ reaching or exceeding the threshold has no effect during this time span $T_{MASK}$ (see FIG. 9, fourth timing diagram). Thus, the comparator threshold voltage $V_R$ is switched a time span $T_{MASK}$ after activation of the MOS transistor $M_P$. The threshold voltage $V_{OFF}$ will be (negative but) close to zero volts and may therefore be higher than the first threshold voltage $V_{ON}$. In the present example, the comparator output signal C will rise from a low level to a high level at time $t_X$ when the comparator reference voltage $V_R$ is set from $V_{ON}$ to $V_{OFF}$. At time instant $t_2$, the substrate voltage $V_{SUBST}$ ($=R_{ON} \cdot i(t)$) between times to and $t_2$) reaching the comparator threshold $V_R = V_{OFF}$ causes the comparator output signal C to drop to a low level, which triggers a reset of the SR flip-flop SR1 (see FIG. 8, the falling edge in signal C at time $t_2$ is converted to a rising edge by inverter I1) and switches the MOS transistor $M_P$ off. As a consequence, the load current $i(t_2)$ is taken over by the MOS transistor's intrinsic reverse diode $D_R$ and thus the substrate voltage $V_{SUBST}$ drops to a voltage $-V_D$, which is the negative forward voltage of the body diode $D_R$ ($-V_D \approx -600$ mV at room temperature). The time span between the switch-off of the MOS transistor $M_P$ (at time $t_2$) and the end of the cycle (the subsequent zero-crossing in the substrate voltage $V_{SUBST}$) is comparably short so that the energy dissipation is kept low).

As mentioned above, any reset signal for resetting the SR flip-flop SR1 (see FIG. 8) and thus for switching-off the MOS transistor $M_P$ is masked; this masking is done in order to avoid an undesired early switch-off of the power MOS transistor $M_P$. However, in practical applications (e.g. when operating the rectifier device 10 in a rectifier bridge coupled to an automotive alternator) some undesired situations may occur, in which the substrate voltage $V_{SUBST}$ becomes positive and thus the diode $D_R$ becomes reverse biased. In such situations, the rectifier device 10 should block any load current flow (as any "normal" diode would do) in order to prevent undesired effects such as short-circuits, cross-conduction in a rectifier bridge, etc. However, if such a situation (i.e. diode $D_R$ reverse biased) occurs during the masking period $T_{MASK}$, the control logic included in control circuit 11 as described with reference to FIGS. 8 and 9, would not allow a switch-off of the power-MOS transistor. Accordingly, some safety measures are needed in order to prevent the mentioned undesired effects (short-circuit, cross-conduction, etc.).

Figure 10:
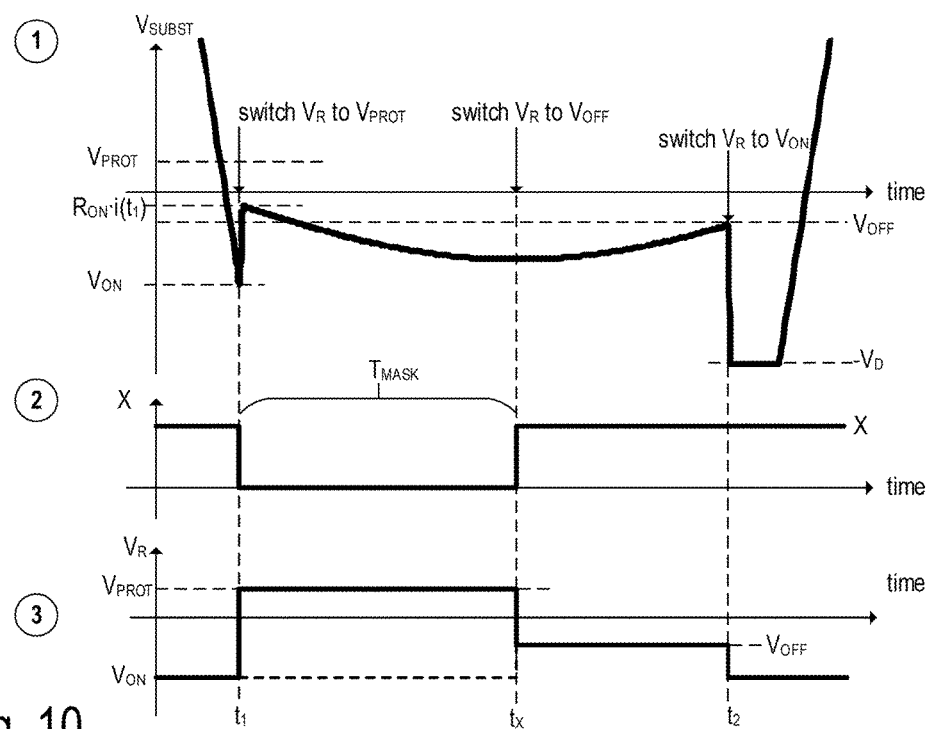
FIGS. 10 and 11 include timing diagrams illustrating an exemplary alternative function similar to the example of FIG. 9 but with an additional safety/protection mechanism.
Figure 11:
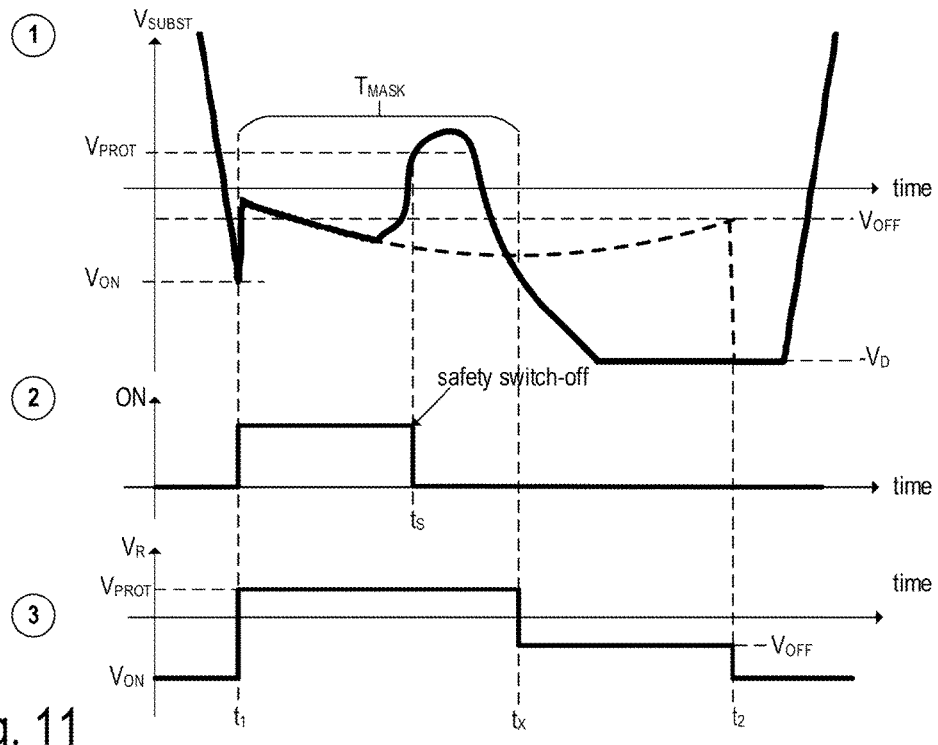

The timing diagrams of FIG. 10 and FIG. 11 illustrate the function of a control circuit 11 with a modified control logic, which includes an additional safety switch-off function (emergency switch-off). In the examples described herein, the masking circuit (see, e.g., FIG. 8, masking circuit 110) is overridden by a safety circuit in order to trigger a safety switch-off of the power MOS transistor MN upon detection that the substrate voltage $V_{SUBST}$ has become positive, which means that the diode $D_R$ has become (again) reverse biased. This safety function may be implemented in various ways. One example is illustrated by the three timing diagrams of FIG. 10. The first (top) timing diagram of FIG. 10 is essentially the same as the first timing diagram of FIG. 9 and shows the second portion of a cycle, during which the substrate voltage $V_{SUBST}$ is negative (i.e. diode $D_R$ is forward biased). When the substrate voltage $V_{SUBST}$ becomes negative, it keeps falling until it reaches the comparator threshold voltage $V_R=V_{ON}$ at time instant $t_1$, which triggers he switch-on of the power MOS transistor $M_P$ (see also the second diagram of FIG. 9). At the same time (time instant $t_1$) the timer circuit TMR is triggered, which outputs a masking signal X that is at a low-level for a time span $T_{MASK}$ after time instant $t_1$ (until $t_X=t_1+T_{MASK}$). The masking signal is illustrated in the second (middle) timing diagram of FIG. 10. The mentioned safety mechanism can be seen in the third (bottom) timing diagram of FIG. 10. Different from the example of FIG. 9, a positive comparator threshold voltage $V_{PROT}$ may be used during the time span $T_{MASK}$ and the masking function of the masking circuit 110 may be overrided in case the substrate voltage becomes positive and reaches or exceeds the threshold voltage $V_{PROT}$. At this point it should be noted that, during normal operation, the substrate voltage $V_{SUBST}$ should not become positive during the time span $T_{MASK}$. However, it might become positive (e.g., due to some abnormal circumstances) and the safety mechanism described herein may be necessary to protect the rectifier device. At the end of the time span $T_{MASK}$ the effective threshold voltage is switched to $V_{OFF}$ as explained with reference to FIGS. 8 and 9. Subsequently, the regular switch-off of the power MOS transistor $M_P$ is effected at time instant $t_2$, which has already described above and is thus not repeated here.

The timing diagrams of FIG. 11 illustrate a case, in which the safety mechanism is triggered by the substrate voltage $V_{SUBST}$ rising above the positive threshold voltage $V_{PROT}$ during the time span $T_{MASK}$. The first (top) timing diagram of FIG. 11 illustrates a similar situation as the first timing diagram of FIG. 10. However, different from the previous example, the substrate voltage $V_{SUBST}$ suddenly rises and reaches the positive threshold voltage $V_{PROT}$ at time instant $t_S$, after the power MOS transistor $M_P$ has been switched on at time instant $t_1$. The second (middle) timing diagram illustrates the corresponding drive signal ON, which controls the switching state of the MOS transistor $M_P$. Accordingly, the power MOS transistor $M_P$ is switched on, when the substrate voltage $V_{SUBST}$ drops to the threshold value $V_{ON}$ at time instant $t_1$ and a safety switch-off is triggered when the substrate voltage $V_{SUBST}$ reaches the threshold $V_{PROT}$ during the time span $T_{MASK}$. The third timing diagram of FIG. 11 is the same as in FIG. 10 and illustrates the comparator threshold values effective during a cycle of the substrate voltage $V_{SUBST}$.

As mentioned the functions that implement the safety mechanism described herein may be implemented in various ways. For example, separate comparators may be used to monitor whether the substrate voltage $V_{SUBST}$ reaches the different threshold values, $V_{ON}$, $V_{PROT}$, $V_{OFF}$, etc. However, in some embodiments two or more threshold values are subsequently applied to the same comparator, i.e. the threshold values may be switched as illustrated, e.g. in the example of FIG. 8.

Figure 12:
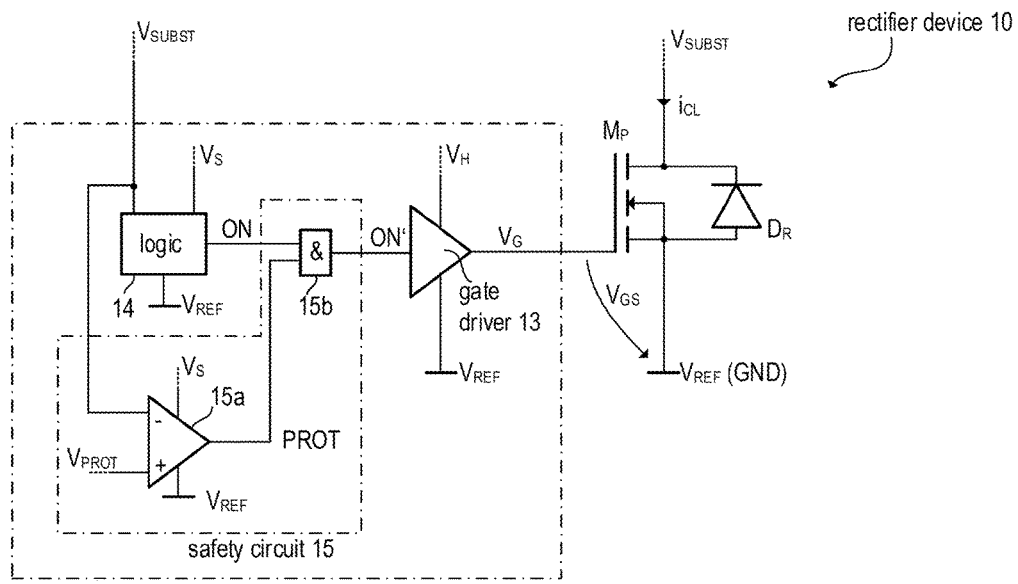
FIG. 12 illustrates one exemplary implementation of the control circuit used to control the switching state of the power MOSFET, wherein the control circuit includes an additional safety circuit.

FIG. 12 illustrates one exemplary implementation of a control circuit 11 including the safety mechanism as described above. The circuit of FIG. 12 is essentially the same as the circuit of FIG. 6B except that an additional safety circuit 15 is included. In the present example, the safety circuit 15 includes a comparator 15a and an AND gate 15b. The comparator 15a is configured to detect whether the substrate voltage $V_{SUBST}$ has reached or exceeded the threshold voltage $V_{PROT}$, which is a small positive voltage of, e.g. +20 mV. In the present example, the inverting input of comparator 15a is connected to substrate, whereas the threshold voltage $V_{PROT}$ is applied to the non-inverting input. Accordingly, the binary comparator output signal PROT is at a high level (PROT=1) while $V_{SUBST}<V_{PROT}$ and changes to a low level (PROT=0) when the substrate voltage $V_{SUBST}$ reaches or exceeds the threshold voltage $V_{PROT}$, i.e. when $V_{SUBST} \geq V_{PROT}$. The AND gate 15b is configured to blank (and thus override) the control signal ON when the safety mechanism is triggered and the comparator output signal PROT switches to a low-level. Accordingly, the output signal ON' of the AND gate 15b is at a low level when PROT=0, even if the control logic signals ON=1.

It is noted that, dependent on the actual implementation, the safety circuit 15 may be configured to be only active during the masking period $T_{MASK}$. However, in the general example of FIG. 15, the safety circuit is active all the time but, nevertheless, only effective during the masking time period $T_{MASK}$ as the threshold voltages $V_{ON}$ and $V_{OFF}$, which are effective before and after the masking time period $T_{MASK}$, are lower. After the masking time period $T_{MASK}$ has lapsed, the a switch-off of the power MOS transistor $M_P$ is triggered when the substrate voltage reaches or exceeds the threshold voltage $V_{OFF}$, which is a negative threshold voltage. Therefore, the substrate voltage will always hit the threshold voltage $V_{OFF}$ before the threshold voltage $V_{PROT}$. Another implementation of the safety circuit is explained later with reference to FIG. 18.

Figure 13A:
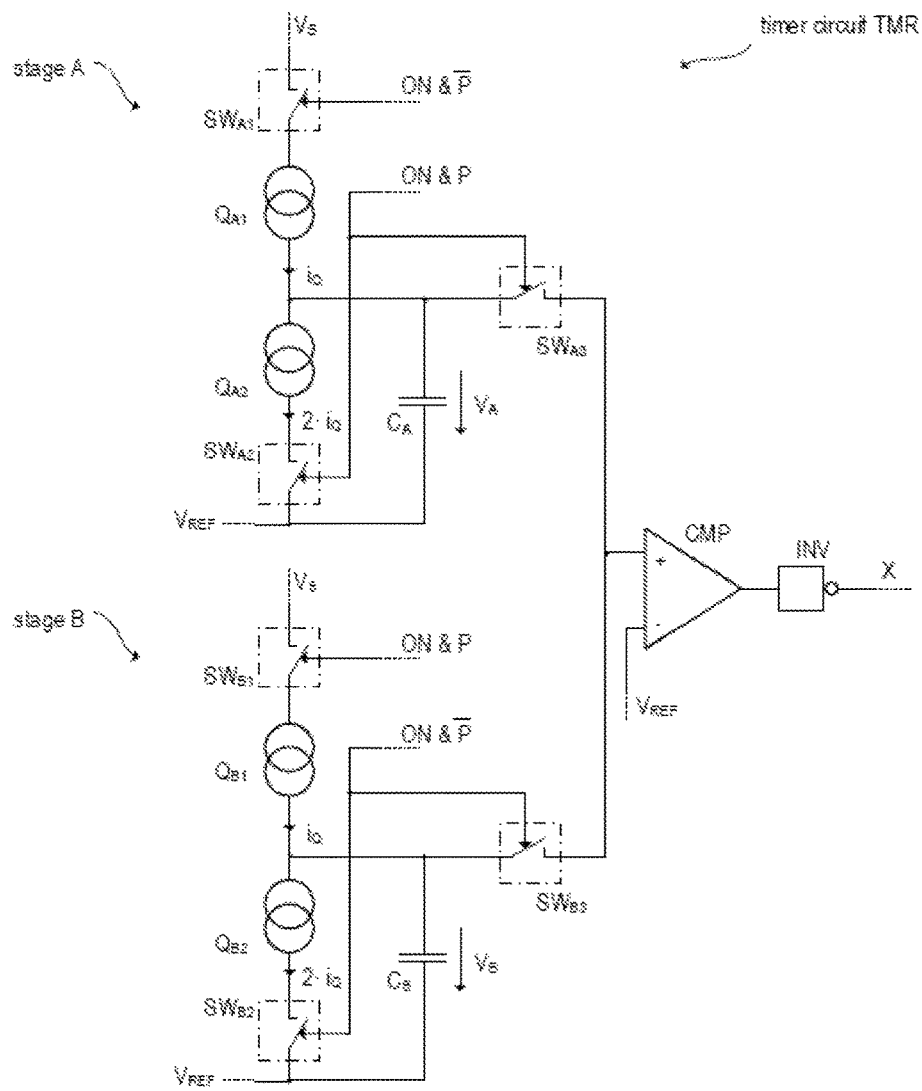
FIGS. 13A and 13B illustrate a timer circuit which may be used in the control circuit of FIG. 8 for masking an early switch-off of the MOSFET.
Figure 13B:
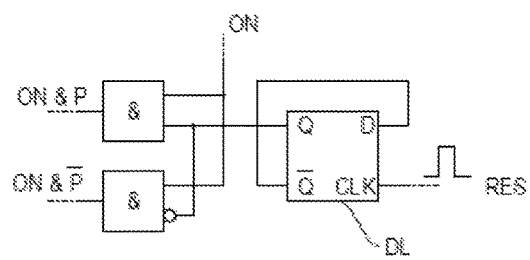

The cycle time of the substrate voltage $V_{SUBST}$ may depend on the application. When the AC voltage is provided by the electric power grid (e.g. via a transformer), the cycle time is substantially constant at approximately 20 ms (for 50 Hz AC voltage) or 16.7 ms (for 60 Hz. AC voltage) or 60 ms (for 16.7 HZ AC voltage). In such applications, the time $T_{MASK}$ indicated by the timer circuit TMR may be set to a constant value. However, in other applications such as in automobiles, the AC voltage may be generated, e.g., by an alternator, and the frequency of the AC voltage varies with the rotational speed of the alternator (which may be connected to the combustion engine of an automobile). In such applications it may be necessary to adjust the time $T_{MASK}$ dependent on the frequency or the cycle time of the AC voltage, which corresponds to the cycle time of the substrate voltage $V_{SUBST}$. FIGS. 13A and 13B illustrate one exemplary analog circuit which may be used to flexibly set the time span $T_{MASK}$ and thus the time instant $t_X$ (see, e.g., FIG. 10), at which the threshold value is set to $V_{OFF}$. It is understood that digital implementation with counters or integrators may be alternatives to the depicted analog implementation, and a person skilled in the art will readily be able to conceive various digital and analog implementations which basically provide the same function as the depicted example.

Generally, the masking circuit 110 is a sub-system configured to measure the length of the on-time $T_{ON}$ (see, e.g., FIG. 7B) of the MOS transistor $M_P$ during a previous cycle of the substrate voltage $V_{SUBST}$. This measurement may be accomplished in various ways; it may be done digitally (e.g., using a counter) as well as analog (e.g. using an integrator). The output X of masking circuit 110 is at a low level ($\approx$0V) between the switch-on of the MOS transistor $M_P$ (see, e.g., FIG. 9, time $t_1$) and approximately the 50 percent of the on-time time $T_{ON}$ of the MOS transistor $M_P$ during the previous cycle ($T_{MASK} \approx 0.5 \cdot T_{ON}$). This percentage may be different from 50 percent, dependent on the actual implementation. However, the masking time $T_{MASK}$ should be long enough to prevent an early switch-off of the MOS transistor $M_P$. It is understood that a ratio $T_{MASK}/T_{ON}$ of approximately 0.5 is merely an illustrative example. In other implementations, the ration may be lower or higher than 0.5.

As mentioned above, the masking circuit 110 prevents the power MOS transistor $M_P$ from switching off for a defined masking (blanking) time $T_{MASK}$. Nevertheless, in real applications (e.g. rectifying the voltage generated by an automotive alternator), undesired, abnormal situations may occur, in which the substrate voltage may become positive during the masking time $T_{MASK}$. In such situations, the masking circuit may be overridden (or deactivated) by a protection circuit, which is configured to switch-off the MOS transistor $M_P$ to avoid short-circuits.

The circuit of FIGS. 13A and 13B illustrates one exemplary implementation of the timer circuit TMR used in the masking circuit 110 of the control logic shown in FIG. 8. FIG. 13A includes two substantially identical charging circuits (labeled "stage A" and "stage B"), which may be used to flexibly determine the time span $T_{MASK}$ dependent on the cycle time of the alternating substrate voltage $V_{SUBST}$. Each charging circuit include a capacitor $C_A$, $C_S$ that is charged by a constant current $i_Q$ for the time span $T_{ON}$ (see, FIG. 7B) in one cycle and discharged by a constant current $2 \cdot i_Q$ in the subsequent cycle. Thus, the time needed to discharge the capacitor $C_A$, $C_B$ determines the time span $T_{MASK}$, which is $T_{ON}/2$ since the discharging current is twice the charging current. As mentioned above, a discharging current different from $2 \cdot i_Q$ (resulting in the mention ratio of 0.5) is possible. Generally a discharging current of $r \cdot i_Q$ would result in a ratio 1/r.

The capacitors $C_A$, $C_B$ are connected to current sources $Q_{A1}$, $Q_{A2}$ and, respectively $Q_{B1}$, $Q_{B2}$. Current sources $Q_{A1}$ and $Q_{B1}$ generate the charging current $i_Q$, whereas current sources $Q_{A2}$ and $Q_{B2}$ generate the discharging current $2 \cdot i_Q$. Each of the current sources $Q_{A1}$, $Q_{A2}$, $Q_{B1}$, and $Q_{B2}$ can be switched on and off by respective switches $SW_{A1}$, $SW_{A2}$, $SW_{B1}$, and $SW_{B2}$. The charging currents $i_Q$ are generated by current sources $Q_{A1}$ and $Q_{B1}$, whereas the discharging currents $2 \cdot i_Q$ are generated by current sinks $Q_{A2}$ and $Q_{B2}$. The two charging circuits operate in an alternating manner. That is, capacitor $C_A$ is charged during even cycles and discharged during odd cycles of the substrate voltage $V_{SUBST}$, whereas capacitor $C_B$ is charged during odd cycles and discharged during even cycles of the substrate voltage $V_{SUBST}$. In the present example, signal P may be used to distinguish even cycles from odd cycles, wherein a high level (P=1) may indicate an odd cycle and a low level may indicate an even cycle. Further, the capacitors are only charged and discharged while the MOSFET $M_P$ is switched on, i.e. when signal ON is at a high level (ON=1, see FIG. 8). Accordingly, switches $SW_{A1}$ and $SW_{A2}$ are switched on while ON=1 and P=0 (logic conjunction ON & $\overline{P}$), whereas $SW_{A2}$ and $SW_{B1}$ are switched on while ON=1 and P=1 (logic conjunction ON & P). While the capacitors $C_A$, $C_B$ are discharged by the constant current $2 \cdot i_Q$, the respective capacitor voltage $V_A$ or $V_B$ is applied to the input of a comparator CMP via a further switch $SW_{A3}$ or $SW_{B3}$, respectively. The comparator CMP signals, at its output, a low level as soon as the capacitor $C_A$, $C_B$ is discharged, which is, in the present example, a time $T_{MASK}=T_{ON}/2$ after activation of the power MOSFET $M_P$. One can see that the time needed for discharging will always be half of the time needed for charging (which is $T_{ON}$) regardless of the actual duration of the time span $T_{ON}$. Finally, the comparator output signal is inverted to generate the masking signal X, which exhibits a low level during the time span $T_{MASK}$ (see also FIGS. 9 and 10).

FIG. 13B illustrates one example of a circuit that may be used to generate the signal P. The example of FIG. 13B includes basically a clocked D-latch which is connected to form a frequency divider. That is, the latch receives the reset signal RES as input signal at the clock input CLK, while the inverted latch output $\overline{Q}$ is fed back to the latch input D. The signal P is provided at the non-inverted latch output $\overline{Q}$. Two AND-gates may be used to obtain the logic conjunctions ON & $\overline{P}$ and ON & P needed to control the switches $SW_{A1}$, $SW_{A2}$, $SW_{A3}$, $SW_{B1}$, $SW_{B2}$, $SW_{B3}$ as described above.

Figure 14:
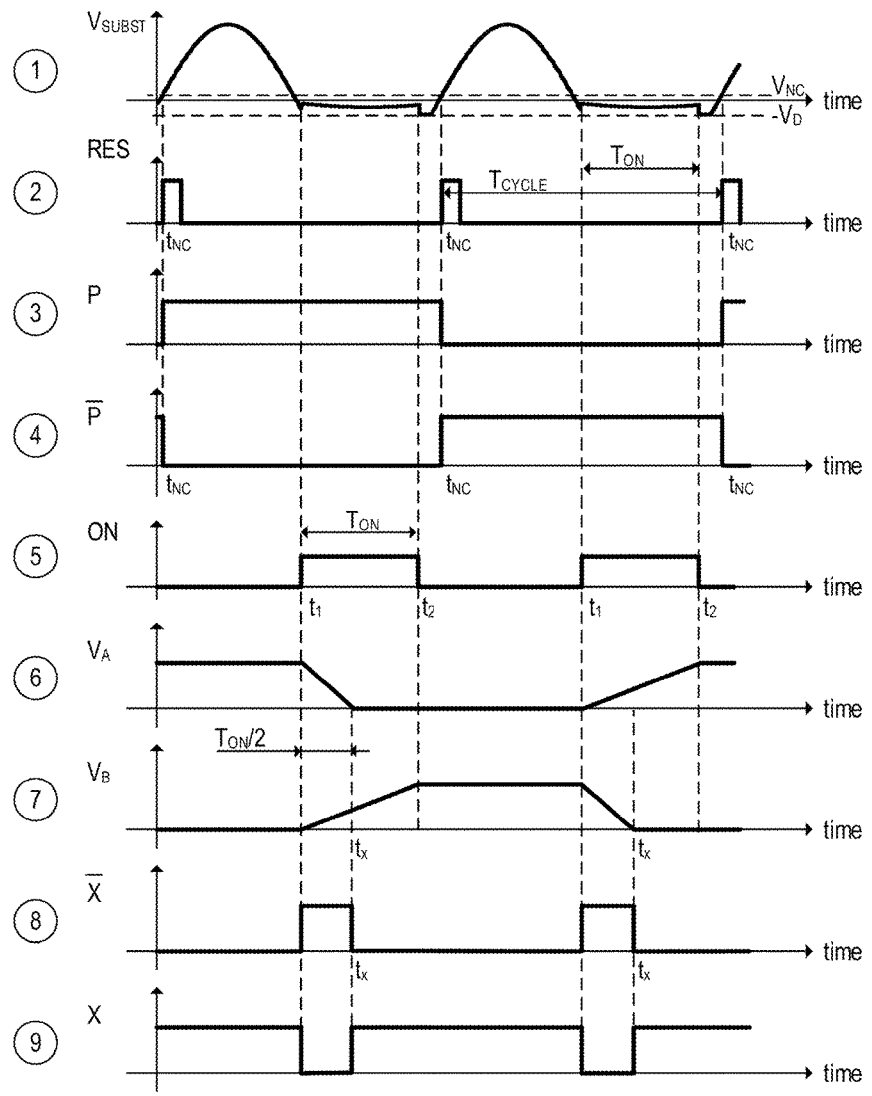
FIG. 14 includes timing diagrams illustrating the function of the timer circuit of FIG. 10 in more detail.

The function of the exemplary timer circuit of FIGS. 13A and 13B (with a ratio $T_{MASK}/T_{ON} \approx 5$) is further illustrated by the timing diagrams shown in FIG. 14. The first timing diagram of FIG. 14 illustrates two cycles (cycle time $T_{CYCLE}$) of the alternating substrate voltage $V_{SUBST}$ (cf. FIG. 7A). The second timing diagram illustrates the corresponding reset signal, which exhibits a short reset pulse at each time instant $t_{NC}$, at which the substrate voltage exceeds the threshold voltage $V_{NC}$. In the present example, the threshold voltage $V_{NC}$ has a small positive value (e.g. 80 mV). However, the threshold voltage $V_{NC}$ may also be zero (see cycle detection circuit in FIG. 6A). The third and the fourth timing diagrams of FIG. 14 illustrate the signal P and its inverse $\overline{P}$ as generated by the circuit shown in FIG. 13B. One can see, the period of signal P is $2 \cdot T_{CYCLE}$, and P exhibits a high level during odd cycles of the substrate voltage $V_{SUBST}$ and exhibits a low level during odd cycles. The fifth timing diagram of FIG. 14 illustrates the output signal ON of SR flip-flop SR1 (see FIGS. 8 and 9). The sixth and the seventh timing diagrams of FIG. 14 illustrate the capacitor voltages $V_A$ and $V_B$ across the capacitors $C_A$ and $C_B$, respectively. As explained above, the two capacitors $C_A$ and $C_B$ are charged and discharged in an alternating manner. That is, the two signal waveforms representing the capacitor voltages are time shifted with respect to each other by one period $T_{CYCLE}$. One can see that the capacitors $C_A$ and $C_B$ are charged for a time $T_{ON}$ (i.e. between the time instants $t_1$ and $t_2$) and discharged for a time $T_{ON}/2$ (i.e. between the time instants $t_1$ and $t_x$). The comparator output signal $\overline{X}$ is illustrated in the eighth timing diagram of and the masking signal X in the ninth timing diagram of FIG. 14. One can see that the masking signal X falls to a low level when the signal ON signals a switch-on of the power MOS transistor $M_P$ and returns to a high level after the masking time $T_{MASK}$, which equals $T_{ON}/2$ in the present example. As mentioned, different ratios may be applicable in other implementations.

Figure 15:
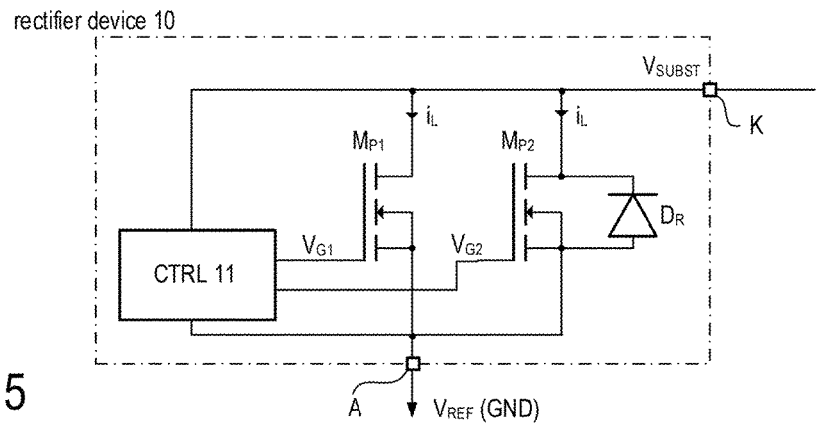
FIG. 15 illustrates an alternative to the example of FIG. 4, wherein two or more power MOSFETs are used instead of a single power MOSFET.

As mentioned above with respect to FIG. 3, the power MOS transistor $M_P$ may be implemented as a vertical MOSFET that is composed of a plurality of transistor cells. That is, the source-drain current paths (or the emitter-collector current paths in case of an IGBT) of the individual transistor cells are connected in parallel to form the transistor $M_P$. To switch the transistor on and off the gate electrodes of all transistor cells are connected so that the gate electrodes are charged and discharged simultaneously. In the embodiments described below the rectifier device 10 includes two or more MOS transistors $M_{P1}$, $M_{P2}$, which are connected in parallel but have separate gate terminals. The MOS transistors $M_{P1}$, $M_{P2}$ may be formed by the transistor cells of a single cell array, wherein the gate electrodes of a first group of transistor cells are connected to the gate terminal of transistor $M_{P1}$ and the gate electrodes of a second group of transistor cells are connected to the gate terminal of transistor $M_{P2}$, while all transistor cells of the cell array share a common source electrode and a common drain electrode. In one example, the first group of transistor cells may include approximately 90 percent of the transistor cells of the cell array while the remaining group includes the remaining 10 percent. An example of such a rectifier device 10 with two power MOS transistors $M_{P1}$ and $M_{P2}$ is illustrated by the equivalent circuit in FIG. 15. Different from the example of FIG. 4, the control circuit 11 needs to generate two gate signals $V_{G1}$ and $V_{G2}$ instead of one to switch the transistors $M_{P1}$ and $M_{P2}$ on and off. The further description is related to the example, in which two MOS transistors $M_{P1}$ and $M_{P2}$ are electrically connected in parallel as illustrated in FIG. 15. However, it is noted that a parallel circuit of three or more MOS transistors may also be used instead. In the examples described herein, two different threshold values $V_{OFF1}$ and $V_{OFF2}$ are used to trigger switch-off of the two MOS transistors $M_{P1}$ and $M_{P2}$, respectively. Three or more threshold values may be used in examples, in which three or more MOS transistors are connected in parallel (instead of two as shown in FIG. 15). Some of the three or more threshold values may be (but need not to be) identical.

Figure 16:
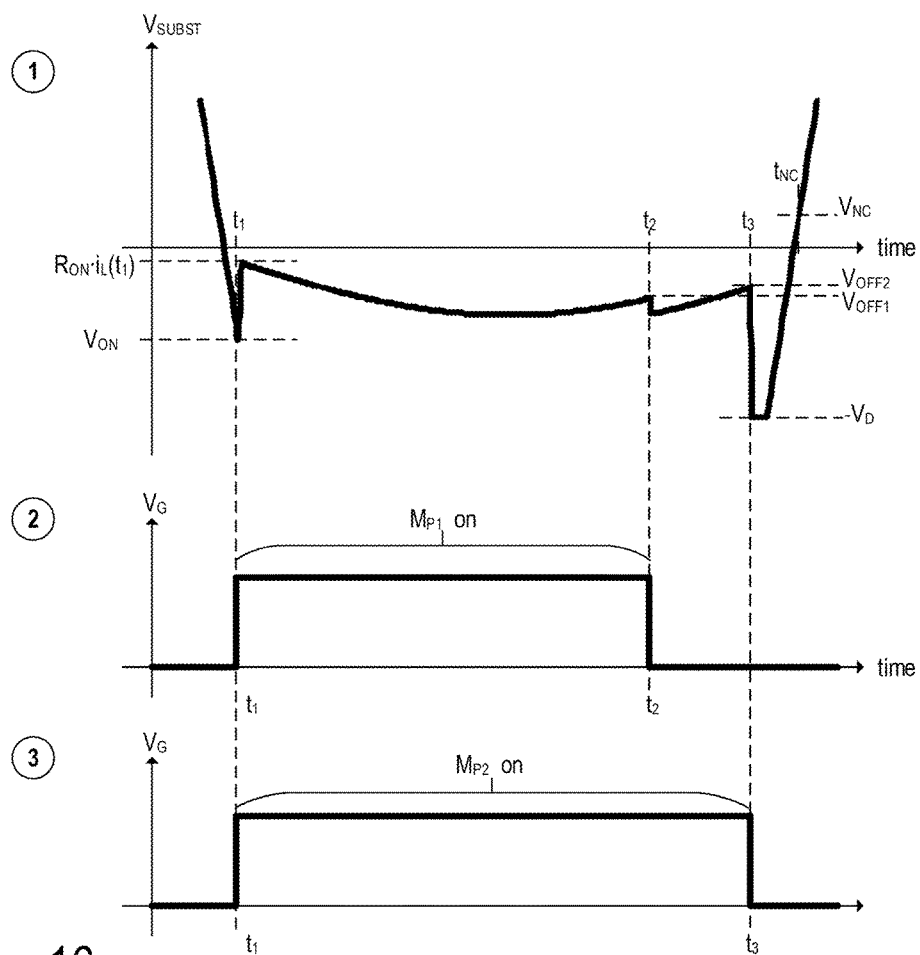
FIG. 16 includes timing diagrams illustrating the voltage drop across the rectifier device of FIG. 15, wherein—when activated—the MOS channels of both power MOSFETs bypass the body diode when the diode is forward biased and wherein the two power MOSFETs are switched of one after the other.

The timing diagrams of FIG. 16 illustrate one exemplary switching scheme for switching the MOS transistors $M_{P1}$ and $M_{P2}$ included in the rectifier device 10 of FIG. 15 on and off while the diode $D_R$ (which is the intrinsic body diode of transistors $M_{P1}$ and $M_{P2}$) is forward biased. Similar as in the example of FIG. 7B, both MOS transistors, $M_{P1}$ and $M_{P2}$, are switched on, when the control circuit 11 detects that the substrate voltage $V_{SUBST}$ is negative (i.e. the diode $D_R$ is forward biased). To determine the time instants for switching the MOS transistors $M_{P1}$ and $M_{P2}$ on and off negative threshold voltages $V_{ON}$, $V_{OFF1}$ and $V_{OFF2}$ may be used as explained below. Accordingly, both MOS transistors $M_{P1}$ and $M_{P2}$ are switched on, when the substrate voltage $V_{SUBST}$ reaches or falls below the first threshold $V_{ON}$. In the present example, the condition $V_{SUBST}=V_{ON}$ is fulfilled at time $t_1$ and the gate voltages $V_{G1}$ and $V_{G2}$ (see second and third diagram of FIG. 16) are set to a high level to switch on the MOS transistor $M_{P1}$ and $M_{P2}$. However, different from the example of FIG. 7B, only the first MOS transistor $M_{P1}$ is switched off again, when the substrate voltage $V_{SUBST}$ reaches or exceeds the second threshold $V_{OFF1}$ at the end of a cycle while the second MOS transistor $M_{P2}$ remains on. In the present example, the condition $V_{SUBST}=V_{OFF1}$ is fulfilled at time $t_2$ and the gate voltage $V_{G1}$ (see second diagram of FIG. 16) is set to a low level to switch the MOS transistor $M_{P1}$ off. When the MOS transistor $M_{P1}$ is switched off at time instant $t_2$, the substrate voltage $V_{SUBST}$ may abruptly fall to a lower level, as the over-all on-resistance $R_{ON}$ is increased due to the switch-off of those transistor cells which form the MOS transistor $M_{P2}$. However, as the load current $i_L$ decreases towards the end of the cycle, the substrate voltage keeps rising and the second MOS transistor $M_{P2}$ is eventually also switched off when the substrate voltage $V_{SUBST}$ reaches the third threshold level $V_{OFF2}$. As soon as both MOS transistors $M_{P1}$ and $M_{P2}$ are off the substrate voltage $V_{SUBST}$ may abruptly fall to $-V_D$ before it again rises to positive values at the beginning of the next cycle (reset pulse at time instant $t_{NC}$).

Figure 17:
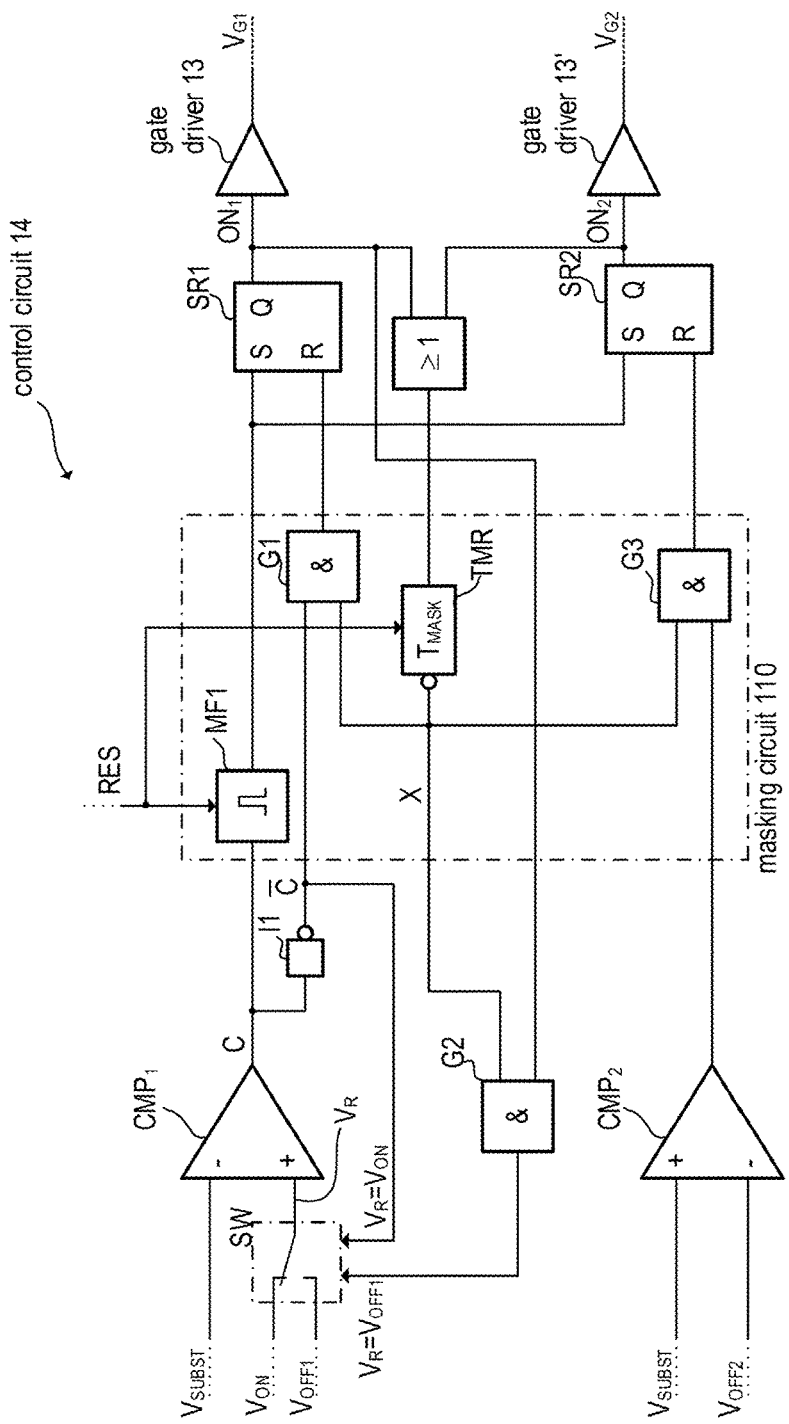
FIG. 17 illustrates an exemplary control logic, which is similar to the example of FIG. 8 but suitable for rectifier devices with two power MOSFETs as shown in FIG. 14.

FIG. 17 is a block diagram illustrating one exemplary implementation of a control logic for the control circuit 11 (see FIG. 15) which is designed to switch the MOS transistors $M_{P1}$ and $M_{P2}$ on and off as illustrated in the timing diagrams of FIG. 16. Various circuit components used in the circuit of FIG. 17 may be supplied by a supply circuit 12 as shown, for example, in FIG. 6A (internal supply voltage $V_S$). In essence the example of FIG. 17 is an enhanced version of the example of FIG. 8. The control logic needed to activate and deactivate the SR flip-flop SR1 is essentially the same as in the previous example of FIG. 8. However, the output signal of SR flip-flop SR1 is denoted ON, and the corresponding threshold as $V_{OFF1}$ as mentioned above. In addition to the example of FIG. 8, the present control logic includes a further SR flip-flop SR2, a further comparator $CMP_2$ and the masking circuit 110 includes an additional AND-gate G3. The set inputs of the two SR flip-flops SR1 and SR2 are connected so that the flip-flops are set simultaneously. The output signal of SR flip-flop SR2 is denoted as $ON_2$ and provided to gate driver 13' that generates a corresponding gate signal $V_{G2}$.

The comparator $CMP_2$ receives the substrate voltage $V_{SUBST}$ and the second threshold voltage $V_{OFF2}$ as input signals, wherein the substrate voltage is supplied to the non-inverting input and the second threshold voltage $V_{OFF2}$ to the inverting input of comparator $CMP_2$ so that the comparator output signals a high level when the substrate voltage $V_{SUBST}$ exceeds the second threshold voltage $V_{OFF2}$. As shown in FIG. 16, the second MOS transistor $M_{P2}$ is to be switched off, when the substrate voltage $V_{SUBST}$ reaches the second threshold voltage $V_{OFF2}$. Therefore the output of comparator $CMP_2$ is coupled (via the masking circuit 110) to the reset input of the SR flip-flop SR2 in order to deactivate SR flip-flop SR2 when the comparator $CMP_2$ indicates that the substrate voltage $V_{SUBST}$ has reached the second threshold voltage $V_{OFF2}$. The masking circuit 110 prevents an undesired early switch-off of both transistors, $M_{P1}$ and $M_{P2}$. To prevent a switch-off of the second transistor $M_{P2}$ during the time span $T_{MASK}$, the masking signal X blanks the output signal of comparator $CMP_2$ so that it cannot reset SR flip-flop SR2. This blanking is accomplished by AND-gate G3 in the same manner as AND-gate G1 blanks the reset signal supplied to SR flip-flop SR1 (cf. FIG. 8).

Figure 18:
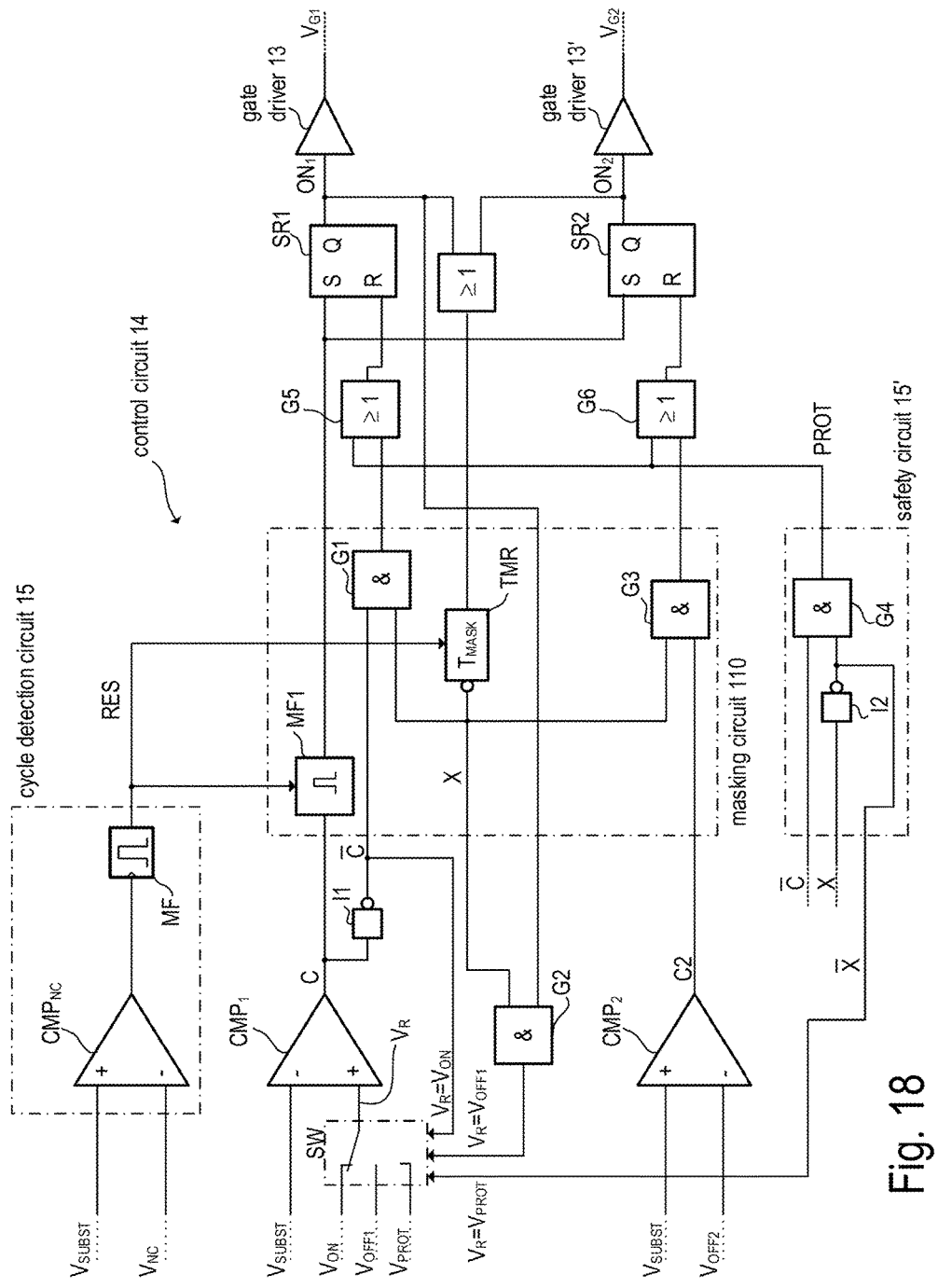
FIG. 18 illustrates a further exemplary control logic, which may be used as an alternative to the example of FIG. 16.

FIG. 18 is a block diagram illustrating another exemplary implementation of a control logic for the control circuit 11 (see FIG. 15) which is designed to switch the MOS transistors $M_{P1}$ and $M_{P2}$ on and off as illustrated in the timing diagrams of FIG. 16. The example of FIG. 18 is essentially the same as the previous example of FIG. 17. However, in addition to the example of FIG. 17, a further threshold voltage $V_{PROT}$ can be supplied to comparator $CMP_1$ via switch SW (in addition to threshold voltages $V_{ON}$ and $V_{OFF1}$ shown in FIG. 17). According to the present example, the threshold voltage $V_{PROT}$ is used to implement the safety mechanism described with reference to FIGS. 10 to 12.

Accordingly, the threshold voltage $V_{PROT}$ is applied during the masking time period $T_{MASK}$ only (see also FIG. 11, third diagram). This time period may be indicated to switch SW by the inverted masking signal $\overline{X}$ which may be provided by inverter I2 coupled to the output of timer TMR. Different from the threshold voltages $V_{ON}$, $V_{OFF1}$, and $V_{OFF2}$, the threshold voltage $V_{PROT}$ may be zero or slightly positive (e.g. approximately a few ten millivolts). Furthermore, the example of FIG. 18 includes a protection circuit (also referred to as safety circuit) that is configured to deactivate both SR latches SR1 and SR2 in order to switch off both MOS transistors $M_{P1}$ and $M_{P2}$ when the substrate voltage $V_{SUBST}$ exceeds the threshold voltage $V_{PROT}$ during the masking time period $T_{MASK}$ (safety switch-off, see also FIG. 11, second timing diagram, time instant $t_S$). Therefore the safety circuit 15'1 includes an AND-gate G4 that is configured to generate an output signal PROT that represents the logic conjunction $\overline{C}$ & $\overline{X}$, wherein the inverted output signal $\overline{C}$ of comparator CMP$_1$ signals (by a high-level) the condition $V_{SUBST}$>$V_{PROT}$ and $\overline{X}$ signals (also by a high level) the masking time period $T_{MASK}$. This, the signal PROT corresponds to signal $\overline{C}$ but is masked by gate G4 except during the masking time period $T_{MASK}$. To deactivate the SR latches SR1 and SR2, the signal PROT is directed to the reset inputs of the SR latches SR1 and SR2 via OR gates G5 and G6 as shown in FIG. 18. In other words, during the masking time period $T_{MASK}$, the masking of the reset signals for SR flip-flops SR1 and SR2 can be overridden by the safety circuit 15' connected with OR-gates G5 and G6, when—for whatever reason—the substrate voltage $V_{SUBST}$ becomes positive during the masking time period $T_{MASK}$. The cycle detection circuit 15 of FIG. 6A is also included in FIG. 18.

Figure 19:
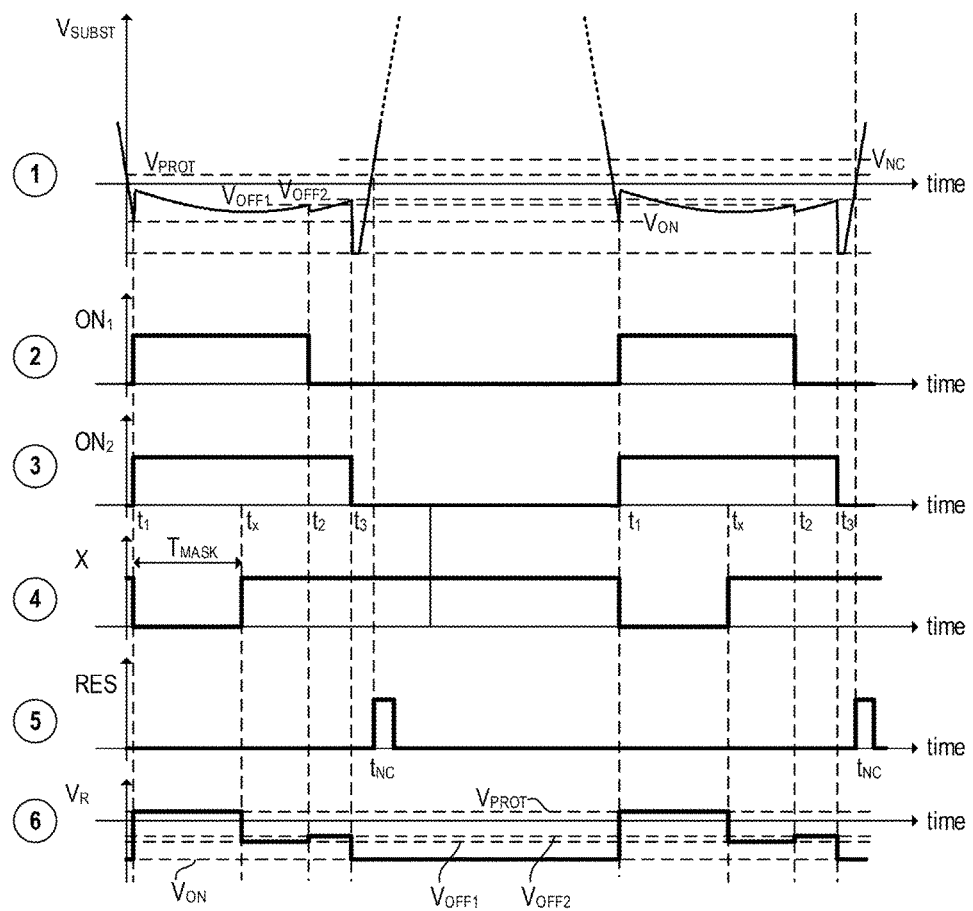
FIG. 19 includes timing diagrams illustrating the function of the control logic of FIG. 18.

The function of the control logic of FIG. 18 is further illustrated by the timing diagrams depicted in FIG. 19. The first timing diagram of FIG. 19 illustrates the alternating substrate voltage $V_{SUBST}$ and the mentioned five threshold levels $V_{ON}$, $V_{OFF1}$, $V_{OFF2}$, $V_{PROT}$, and $V_{NC}$. The second and third timing diagrams of FIG. 19 illustrate the output signals ON$_1$ and ON$_2$ of the SR flip-flops SR1 and SR2, respectively. Both signals ON$_1$ and ON$_2$ are set to a high-level at time instant $t_1$ when the substrate voltage $V_{SUBST}$ reaches the threshold voltage $V_{ON}$. The signal ON$_1$ is set back when the substrate voltage $V_{SUBST}$ reaches the threshold voltage $V_{OFF1}$ at time instant $t_2$, and the signal ON$_2$ is set back when the substrate voltage $V_{SUBST}$ reaches the threshold voltage $V_{OFF2}$ at time instant $t_3$. The fourth timing diagram of FIG. 19 illustrates the masking signal X and the fifth timing diagram of FIG. 19 illustrates the reset signal RES. The sixth timing diagram of FIG. 19 shows how the threshold voltage $V_R$ used by comparator CMP$_1$ are switched from $V_{ON}$ to $V_{PROT}$ at the begin of the masking time period $T_{MASK}$, then to $V_{OFF1}$ at the end of the masking time period $T_{MASK}$, then to $V_{OFF2}$ at time instant $t_2$ (when the switch-off of the first MOS transistor $M_{P1}$ is triggered), and finally back to $V_{ON}$ at time instant $t_3$ (when the switch-off of the second MOS transistor $M_{P2}$ is triggered). It is again noted that both signals ON$_1$ and ON$_2$ would be immediately reset to a low level if the substrate voltage $V_{SUBST}$ rises (due to some anomaly) above the threshold $V_{PROT}$ during the masking time period $T_{MASK}$.

As shown in the first timing diagram of FIG. 19, five threshold voltages are used by the control logic of FIG. 18. In the examples described herein, three threshold voltages may be negative. For example, the threshold voltage $V_{ON}$ may be −250 mV, the threshold voltage $V_{OFF1}$ may be −50 mV, the threshold voltage $V_{OFF2}$ may be −20 mV, the threshold voltage $V_{PROT}$ may be +30 mV and the threshold voltage $V_{NC}$ may be +600 mV. It is understood that these numbers have to be regarded as illustrative examples and the actual values may be different. In case the transistor cells of the power MOS transistor are switched off in a single step (see example of FIG. 4 with one power MOS transistor $M_P$), the threshold voltage $V_{OFF2}$ is not needed. In case the transistor cells of the power MOS transistor are switched off in more than two steps, additional threshold voltages may be needed. However, the threshold voltages $V_{OFF1}$ and $V_{OFF2}$ may also be equal. Theoretically, the threshold voltages $V_{OFF1}$ and $V_{OFF2}$ may be set to zero. However, small negative values may have help to ensure that the comparators do not switch off the power MOS transistors too late due to production tolerances. For example, a threshold voltage $V_{OFF}$ of zero volts may result in the comparator switching actually at +20 mV due to the mentioned tolerances.

Figure 20:
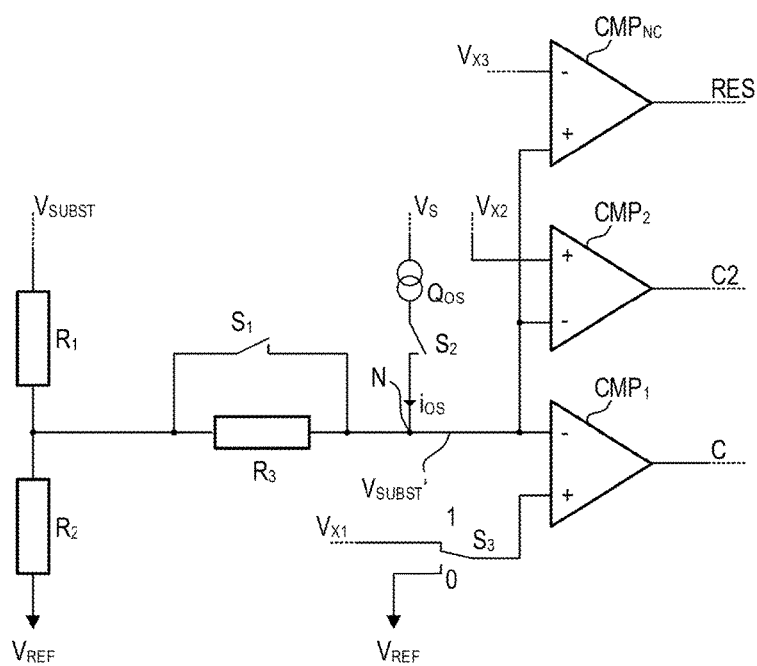
FIG. 20 illustrates one example of how the threshold voltages used by the comparators in the example of FIG. 18 may be switched.

As the rectifier devices described herein usually have exactly two terminals (anode/reference terminal A and cathode/reference terminal K), a separate supply terminal is not available and the supply voltage $V_S$ has to be generated internally as shown, for example, in FIG. 6A. In this regard, it should be noted that the implementation of negative threshold voltages is not straightforwardly possible if a negative supply voltage is not available. FIG. 20 illustrates one example of how negative threshold voltages may be effectively implemented without needing a negative supply voltage. The example of FIG. 20 includes the three comparators CMP$_1$, CMP$_2$, and CMP$_{NC}$ which have been used in the control logic of FIG. 18. However, in the present example, positive threshold voltages $V_{X1}$, $V_{X2}$, and $V_{X3}$ are used, respectively. Different from the previous examples, the substrate voltage $V_{SUBST}$ is not directly supplied to the comparator input but rather the voltage $V_{SUBST}'$, which is a scaled and level shifted version of the substrate voltage $V_{SUBST}$. As can be seen from FIG. 20, a voltage divider composed of resistors $R_1$ and $R_2$ may be used to scale the substrate voltage $V_{SUBST}$, wherein the resistors $R_1$ and $R_2$ are connected in series between substrate and reference potential $V_{REF}$ (i.e. between the anode and the cathode terminal of the rectifier device, cf. FIG. 3). The resistors $R_1$ and $R_2$ may have equal resistances. A further resistor $R_3$ may be coupled between the middle tap of the voltage divider $R_1$, $R_2$ and a switchable current source $Q_{OS}$, that may be switched on and off by a switch $S_2$. A further switch $S_1$ may be used to bypass (if switch $S_1$ is closed) resistor $R_3$. When switched on (switch $S_2$ closed), the current source $Q_{OS}$ feeds an offset current $i_{OS}$ into the circuit node N, which is connected to the middle tap of the voltage divider $R_1$, $R_2$ via resistor $R_3$. The voltage present at the circuit node N is the above-mentioned voltage $V_{SUBST}'$, which is supplied to the inputs of the comparators CMP$_1$, CMP$_2$, and CMP$_{NC}$, respectively.

If switch $S_2$ is open, then the offset current $i_{OS}$ is zero and the voltage $V_{SUBST}'$ equals $V_{SUBST} \cdot R_2/(R_1+R_2)$, i.e. the voltage $V_{SUBST}'$ is proportional to the substrate voltage $V_{SUBST}$ without any offset. If switch $S_2$ is closed, then the offset current $i_{OS}$ is greater than zero (e.g. in the range of a few microamperes) and the voltage $V_{SUBST}'$ equals $$V_{SUBST}' = V_{SUBST} \cdot R_2/(R_1+R_2) + i_{OS} \cdot R_1 \cdot R_2/(R_1+R_2) + i_{OS} \cdot R_3.$$

wherein the thirds term $i_{OS} \cdot R_3$ is zero when switch $S_1$ is closed to bypass resistor $R_3$. In other words, an offset can be added to the scaled substrate voltage $V_{SUBST} \cdot R_2/(R_1+R_2)$ by closing switch $S_2$ and the offset is greater if switch $S_1$ is open. Finally, the threshold voltage used by comparator CMP$_1$ may be switched between a positive value $V_{X1}$ and reference voltage $V_{REF}$ (0 V) using switch $S_3$.

As can be seen from FIG. 20 and the above description, negative threshold voltages may be implemented by adding an offset voltage to the substrate voltage (or the scaled substrate voltage) and using corresponding threshold values (equal or greater than zero) that are level shifted by a corresponding offset voltage. If we assume $R_1=R_2=50$ k$\Omega$, $R_3=100$ k$\Omega$ and $i_{OS}=1$ µA, the above equation simplifies to $V_{SUBST}'=V_{SUBST}/2+V_{OS}$, wherein $V_{OS}$ is 25 mV, when switches $S_1$ and $S_2$ are closed (resistor $R_3$ is bypassed by switch $S_1$), and $V_{OS}=125$ mV when switch $S_2$ is closed and switch $S_1$ is open.

To implement, in the present example, an effective threshold voltage $V_{ON}$ of −250 mV, switch $S_1$ is opened (resistor $R_3$ not bypassed), switch $S_2$ is closed (offset current source $Q_{OS}$ active), and switch $S_3$ is in position "0" ($V_{REF}=0$V is supplied to the comparator $CMP_1$ input as threshold voltage, wherein the effective threshold voltage is −250 mV). Similarly, to implement an effective threshold voltage $V_{OFF1}$ of −50 mV, switch $S_1$ is closed (resistor $R_3$ is bypassed), switch $S_2$ is closed (offset current source $Q_{OS}$ active), and switch $S_3$ is in position "0" ($V_{REF}=0$V is supplied to the comparator $CMP_1$ input as threshold voltage). To implement an effective threshold voltage $V_{OFF2}$ of −20 mV, switch $S_1$ is closed (resistor $R_3$ is bypassed), switch $S_2$ is closed (offset current source $Q_{OS}$ active), and a positive threshold voltage $V_{X2}$ of 15 mV is used for comparator $CMP_2$. To implement an effective threshold voltage $V_{PROT}$ of 30 mV, switch $S_2$ is open (offset current source $Q_{OS}$ inactive), switch $S_3$ is in position "1" ($V_{X1}=15$ mV is supplied to the comparator $CMP_1$ input as threshold voltage), and the position of switch $S_1$ is irrelevant. To implement an effective threshold voltage $V_{NC}$ of −600 mV, switch $S_1$ is closed (resistor $R_1$ is bypassed), switch $S_2$ is closed (offset current source $Q_{OS}$ active), and a positive threshold voltage $V_{X3}$ of 325 mV is used for comparator $CMP_{NC}$.

It is understood that a skilled person can find various other circuit implementations which substantially provide the same or a similar function. Therefore, it is emphasized that the implementation illustrated in FIG. 20 has to be regarded as an illustrative example only. The same is true for the exemplary implementations of the control logic illustrated in FIGS. 8, 17, and 18. A skilled person will readily find various other implementations which provide substantially the same function as the depicted examples. In fact, the actual implementation may heavily depend on the semiconductor technology used to fabricate integrated circuits. Furthermore, it is understood that the depicted implementations are represented by simplified equivalent circuits, in which components, which are not needed to describe the example, have been omitted. Nevertheless, a skilled person will readily be able to implement the depicted examples in any suitable semiconductor technology.

Figure 21:
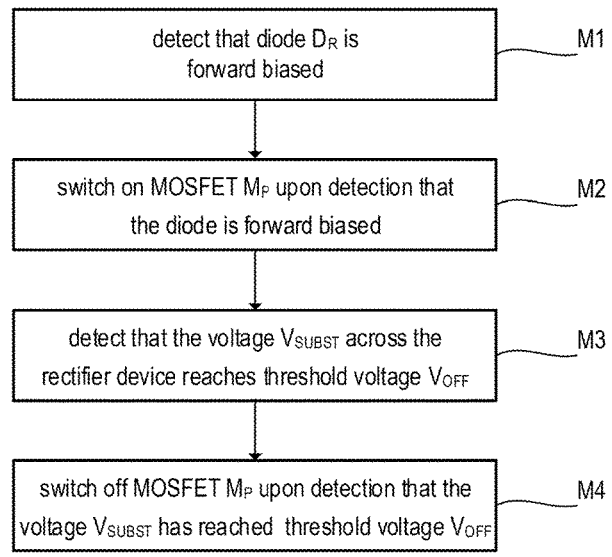
FIG. 21 illustrates a flow chart illustrating one exemplary method for operating a rectifier device.

FIG. 21 illustrates a flow chart illustrating one exemplary method for operating a rectifier device, which may be implemented according to one of the examples described herein (e.g. rectifier device 10 as shown in FIG. 4). Accordingly, the rectifier device includes a semiconductor switch and a diode coupled in parallel between a first and a second terminal of the rectifier device (see, e.g., FIG. 4 MOSFET $M_P$, diode $D_R$). In accordance with the example of FIG. 21, the method includes detecting that the diode $D_R$ is forward biased (see FIG. 21, step M1). This detection may be accomplished, for example, by detecting that the voltage $V_{SUBST}$ across the rectifier device 10 falls below the threshold voltage $V_{ON}$ as illustrated in FIGS. 7A and 7B. The semiconductor switch $M_P$ is switched on (see FIG. 21, step M2) upon detection that the diode $D_R$ is forward biased. The method further includes detecting—while the diode $D_R$ is forward biased—that the voltage $V_{SUBST}$ reaches a the threshold voltage $V_{OFF}$ (see FIG. 21, step M3). The semiconductor switch $M_P$ is switched off upon detection that the voltage $V_{SUBST}$ has reached the threshold voltage $V_{OFF}$ (see FIG. 21, step M3).

In case the rectifier device is implemented with two or more semiconductor switches (e.g. with MOSFET $M_{P1}$ and $M_{P2}$ as shown in FIG. 15), the switch-off may be effected in two steps as, for example, illustrated in FIG. 16. It is again noted, that the method steps may be implemented in various ways. These encompass using digital and analog as well as mixed-signal circuits. Digital circuits may include hard-wired circuit components as well as programmable processors (e.g. microcontrollers or the like) that are controlled by software instructions.

Figure 22:
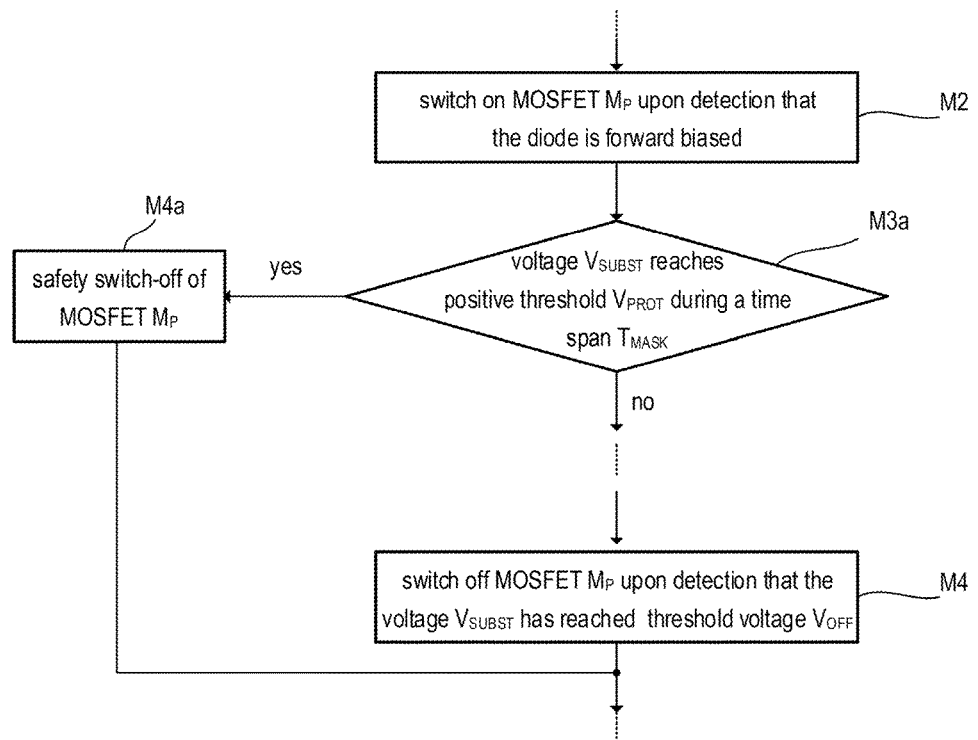
FIG. 22 illustrates a flow chart illustrating the method of FIG. 21 with an additional safety/protection mechanism.

FIG. 22 illustrates a flow chart illustrating the method of FIG. 21 with an additional safety/protection mechanism, which may be, for example, implemented as illustrated by the timing diagrams of FIG. 11. Accordingly, after step M2 (switch-on of MOSFET $M_P$), a detections step M3a may follow for detection whether or not the substrate voltage $V_{SUBST}$ reaches a positive safety threshold $V_{PROT}$ during the time span $T_{MASK}$ which follows the switch-on of the MOS transistor $M_P$ (see, e.g. FIG. 11). If the threshold $V_{PROT}$ is not reached during the time span $T_{MASK}$, the method continues with steps M3 and M4 as illustrated in FIG. 21. Otherwise, if the threshold $V_{PROT}$ is reached during the time span $T_{MASK}$, a safety switch-off of power MOS transistor $M_P$ (or both transistors $M_{P1}$ and $M_{P2}$ if two transistors are used as in the example of FIG. 15) is effected (see FIG. 22, step M4a).

Several aspects of the embodiments described herein are summarized below. It is noted, however, that the following summary is not an exhaustive enumeration of features but rather an exemplary selection of features which may be important or advantageous in some applications. In accordance with one example (Example 1), a rectifier device includes an anode terminal and a cathode terminal, which are connected by a load current path of a first MOS transistor and a diode connected parallel to the load current path. An alternating input voltage is operably applied between the cathode terminal and the anode terminal. The rectifier device further includes a control circuit. the control circuit includes a control logic that is configured to switch on the first MOS transistor for an on-time period, during which the diode is forward biased. The control circuit further includes a safety circuit that is configured to trigger a switch-off of the first MOS transistor when the input voltage reaches a safety threshold.

Example 2

The rectifier device according to example 1, wherein the electrical potential at the anode terminal serves as reference potential for the control logic.

Example 3

The rectifier device according to example 1 or 2, wherein the electrical potential at the anode terminal serves as reference potential for the control logic and the safety circuit, and wherein the safety threshold represents a voltage level that is positive with respect to the reference potential.

Example 4

The rectifier device according to any of examples 1 to 3, wherein the safety threshold is programmable.

Example 5

The rectifier device according to any of examples 1 to 4, wherein the control logic is configured to detect the begin of the on-time period by detecting that the diode has become conductive.

Example 6

The rectifier device according to any of examples 1 to 5, wherein the control logic is configured to detect the begin of the on-time period by detecting that the voltage between cathode and anode terminal has reached a defined first threshold voltage.

Example 7

The rectifier device according to any of examples 1 to 6, wherein the electrical potential at the anode terminal serves as reference potential for the control logic, and wherein the control logic is configured to detect the begin of the on-time period when the input voltage falls below a first threshold voltage that is negative with respect to the reference potential.

Example 8

The rectifier device according to example 6 or 7, wherein the control logic is configured to detect the end of the on-time period by detecting that the voltage between cathode and anode terminal has reached a defined second threshold voltage.

Example 9

The rectifier device according to example 8, wherein the second threshold level is closer to zero than the first threshold level.

Example 10

The rectifier device according to any of examples 1 to 9, wherein the electrical potential at the anode terminal serves as reference potential for the control logic, wherein the control logic is configured to: detect the begin of the on-time period when the input voltage falls below a first threshold voltage that is negative with respect to the reference potential; and to detect the end of the on-time period when the input voltage reaches a second threshold voltage that is also negative with respect to the reference potential.

Example 11

The rectifier device according to any of examples 1 to 10, further including: at least a second MOS transistor having a load current path that is connected parallel to the load current path of the first MOS transistor.

Example 12

The rectifier device according to example 11, wherein the control logic is configured to switch on the first MOS transistor and the second MOS transistor subsequently or substantially at the same time.

Example 13

The rectifier device according to example 11 or 12, wherein the control logic is configured to switch the second MOS transistor off later than the first MOS transistor.

Example 14

The rectifier device according to example 13, wherein the control logic configured to detect the end of the on-time period by detecting that the voltage between cathode and anode terminal has reached a defined second threshold voltage, and wherein the second MOS transistor is switched off upon detection that the voltage between cathode and anode terminal has reached a defined third threshold voltage after the first MOS transistor has been switched off.

Example 15

The rectifier device according to example 14, wherein the third threshold voltage is closer to zero than the second threshold voltage.

Example 16

The rectifier device according to any of examples 1 to 15, wherein the first MOS transistor and the control circuit are integrated in the same semiconductor substrate, and wherein the anode terminal and the cathode terminal are the only external terminals of the rectifier device.

Example 17

The rectifier device according to any of examples 1 to 16, wherein the first MOS transistor is a first MOSFET and the diode is a body diode of the first MOSFET.

Example 18

The rectifier device of example 17, further including: a second MOSFET, wherein the first MOSFET and the second MOSFET are both composed of a plurality of transistor cells.

Example 19

The rectifier device according to example 18, wherein the first and the second MOSFETs are vertical DMOS transistors.

Example 20

The rectifier device according to any of claims 1 to 19, wherein the control circuit is configured: to detect the begin of the on-time period by detecting a first time instant, at which the voltage drop across the diode has reached a defined first threshold voltage; to detect the end of the on-time period by detecting a second time instant, at which the voltage drop across the load current path of the first MOS transistor has reached a defined second threshold voltage; and to mask out any detection of the second time instant for a defined masking time period.

Example 21

The rectifier device according to example 20, wherein the safety circuit is active during the masking time.

Example 22

The rectifier device according to example 20 or 21, wherein the masking time period is adjusted based on the on-time period in a previous cycle of the alternating input voltage.

In accordance with another example (Example 23), a rectifier device includes a semiconductor substrate, a plurality of transistor cells arranged in the semiconductor substrate, and a first MOS transistor composed of at least a portion of the plurality of transistor cells. The first MOS transistor has a load current path and body diode coupled parallel to the load current path. The rectifier device further includes an anode terminal and a cathode terminal connected by the load current path of the first MOS transistor and the body diode. Furthermore, the rectifier device includes a control circuit. The control circuit includes a control logic that is configured to switch on the first MOS transistor upon detection that a voltage between cathode and anode terminal reaches a first threshold voltage. The control logic is further configured to switch off the first MOS transistor upon detection that the voltage between cathode and anode terminal reaches a second threshold voltage, wherein the anode terminal has an electric potential that serves as ground potential for the control circuit, and wherein the first and the second threshold voltages are negative. Moreover, the control circuit includes a safety circuit that is configured to trigger a switch-off of the first MOS transistor when the voltage between cathode and anode terminal reaches a safety threshold, which is a positive threshold voltage.

Example 24

The rectifier device of example 23, further including: a second MOS transistor composed of a further portion of the plurality of transistor cells, the second MOS transistor having a load current path coupled parallel to the load current path of the first MOS transistor, wherein the control logic is further configured to: switch on the second MOS transistor at the same time or subsequent to the first MOS transistor; and to switch off the second MOS transistor upon detection that the voltage between cathode and anode reaches a third threshold voltage.

Example 25

The rectifier device of example 23 or 24, wherein the control logic is configured to mask out, for a specific masking time, any detection that the voltage between cathode and anode reaches the second threshold voltage, and wherein the safety circuit remains active during the masking time.

Example 26

The rectifier device of example 25, wherein the masking time is adjusted based on an on-time of the first semiconductor switch in a previous cycle of the voltage between cathode and anode terminal.

Furthermore, a method for operating a rectifier device is described herein. In accordance to one example (Example 27), the rectifier device includes a MOS transistor and a diode, both coupled in parallel between an anode terminal and a cathode terminal, and the method includes: detecting that the diode is forward biased and switching on, by a control circuit, the MOS transistor upon detection that the diode is forward biased. The method further includes detecting, while the diode is forward biased, that the voltage across the rectifier device between the cathode terminal and the anode terminal reaches a specific threshold voltage and switching off the MOS transistor upon detection that the voltage across the rectifier device has reached the specific threshold value. Furthermore, the method includes detecting that a voltage between cathode and anode terminal rises above a safety threshold and switch-off, by the control circuit, the MOS transistor upon detection that the safety threshold has been hit.

Example 28

The method of example 27, wherein the detection that the safety threshold has been hit is effective during a masking time following the switch-on of the MOS transistor, and wherein the detection that the voltage across the rectifier device has reached the specific threshold value is masked during the masking time.

Example 29

The method of example 27 or 28, further including: generating an internal supply voltage for the control circuit, based on the voltage across the rectifier device between the cathode terminal and the anode terminal, wherein the electric potential at the anode terminal is used as ground potential for the control circuit.

Example 30

The method of example 29, wherein the rectifier device comprises a further MOS transistor coupled parallel to the diode between the anode terminal and the cathode terminal; the method further including: switching on, by a control circuit, the further MOS transistor upon detection that the diode is forward biased; detecting, after the MOS transistor has been switched off, that the voltage across the rectifier device between the cathode terminal and the anode terminal reaches a specific further threshold voltage; and switching off the further MOS transistor upon detection that the voltage across the rectifier device has reached the specific further threshold value.

In accordance with a further example (Example 31) a rectifier device includes an anode terminal and a cathode terminal connected by a load current path of a first MOS transistor and a diode connected parallel to the load current path. An alternating input voltage is operably applied between the anode terminal and the cathode terminal. The electrical potential at the anode terminal serves as reference potential rectifier device; and a control circuit includes: control logic that is configured to switch on the first MOS transistor for an on-time period, during which the diode is forward biased; and a safety circuit that is configured to trigger a switch-off of the first MOS transistor when the input voltage reaches a safety threshold. Thereby, the control circuit includes at least one comparator circuit configured to compare the voltage at the cathode terminal with at least one threshold voltage, and the comparator receives, as a first input signal, a level-shifted and scaled representation of the voltage at the cathode terminal, and uses, as a second input signal, a level shifted and a scaled version of the threshold voltage.

Example 32

The rectifier device of example 31, wherein the scaling of the voltage at the cathode terminal is accomplished by a voltage divider and the level shifting by injecting a bias current into the voltage divider.

Although the invention has been illustrated and described with respect to one or more implementations, alterations and/or modifications may be made to the illustrated examples without departing from the spirit and scope of the appended claims. As mentioned above, the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:

1. A rectifier device comprising:
an anode terminal and a cathode terminal connected by a load current path of a first MOS transistor and a diode connected parallel to the load current path; an alternating input voltage is operably applied between the anode terminal and the cathode terminal; and
a control circuit comprising:
control logic configured to:
switch on the first MOS transistor for an on-time period, during which the diode is forward biased;
detect a beginning of the on-time period by detecting a first time instant, at which a voltage drop across the diode has reached a defined first threshold voltage;
detect an ending of the on-time period by detecting a second time instant, at which the voltage drop across the load current path of the first MOS transistor has reached a defined second threshold voltage; and
mask out any detection of the second time instant for a defined masking time period; and
a safety circuit configured to trigger a switch-off of the first MOS transistor when the input voltage reaches a safety threshold.

2. The rectifier device of claim 1, wherein an electrical potential at the anode terminal serves as reference potential for the control logic.

3. The rectifier device of claim 1,
wherein an electrical potential at the anode terminal serves as reference potential for the control logic and the safety circuit, and
wherein the safety threshold represents a voltage level that is positive with respect to the reference potential.

4. The rectifier device of claim 1, wherein the safety threshold is programmable.

5. The rectifier device of claim 1, wherein the control logic is configured to detect the beginning of the on-time period by detecting that the diode has become conductive.

6. The rectifier device of claim 1,
wherein an electrical potential at the anode terminal serves as reference potential for the control logic, and
wherein the control logic is configured to detect the beginning of the on-time period when the input voltage falls below the first threshold voltage that is negative with respect to the reference potential.

7. The rectifier device of claim 1, wherein the second threshold level is closer to zero than the first threshold level.

8. The rectifier device of claim 1,
wherein an electrical potential at the anode terminal serves as reference potential for the control logic,
wherein the control logic is configured to:
detect the beginning of the on-time period when the input voltage falls below the first threshold voltage that is negative with respect to the reference potential; and
detect the end of the on-time period when the input voltage reaches a second threshold voltage that is also negative with respect to the reference potential.

9. The rectifier device of claim 1, further comprising at least a second MOS transistor having a load current path that is connected parallel to the load current path of the first MOS transistor.

10. The rectifier device of claim 9, wherein the control logic is configured to switch on the first MOS transistor and the second MOS transistor subsequently or substantially at the same time.

11. The rectifier device of claim 9, wherein the control logic is configured to switch the second MOS transistor off later than the first MOS transistor.

12. The rectifier device of claim 11,
wherein the control logic configured to detect the end of the on-time period by detecting that a voltage between cathode and anode terminal has reached a defined second threshold voltage, and
wherein the second MOS transistor is switched off upon detection that the voltage between cathode and anode terminal has reached a defined third threshold voltage after the first MOS transistor has been switched off.

13. The rectifier device of claim 12, wherein the third threshold voltage is closer to zero than the second threshold voltage.

14. The rectifier device of claim 1,
wherein the first MOS transistor and the control circuit are integrated in the same semiconductor substrate, and
wherein the anode terminal and the cathode terminal are the only external terminals of the rectifier device.

15. The rectifier device of claim 1, wherein the first MOS transistor is a first MOSFET and the diode is a body diode of the first MOSFET.

16. The rectifier device of claim 15, further comprising a second MOSFET, wherein the first MOSFET and the second MOSFET are both composed of a plurality of transistor cells.

17. The rectifier device of claim 16, wherein the first and the second MOSFETs are vertical DMOS transistors.

18. The rectifier device of claim 1, wherein the safety circuit is active during the masking time.

19. The rectifier device of claim 1, wherein the masking time period is adjusted based on the on-time period in a previous cycle of the alternating input voltage.

20. A rectifier device comprising:
a semiconductor substrate;
a plurality of transistor cells arranged in the semiconductor substrate;
a first MOS transistor composed of at least a portion of the plurality of transistor cells, the first MOS transistor having a load current path and body diode coupled parallel to the load current path;
an anode terminal and a cathode terminal connected by the load current path of the first MOS transistor and the body diode; and
a control circuit comprising:
a control logic that is configured to switch on the first MOS transistor upon detection that a voltage between cathode and anode terminal reaches a first threshold voltage and further configured to switch off the first MOS transistor upon detection that the voltage between cathode and anode terminal reaches a second threshold voltage, wherein the anode terminal has an electric potential that serves as ground potential for the control logic, and wherein the first and the second threshold voltages are negative; and
a safety circuit that is configured to trigger a switch-off of the first MOS transistor when the voltage between cathode and anode terminal reaches a safety threshold, which is a positive threshold voltage.

21. The rectifier device of claim 20, further comprising a second MOS transistor composed of a further portion of the plurality of transistor cells, the second MOS transistor having a load current path coupled parallel to the load current path of the first MOS transistor,
wherein the control logic is further configured to:
switch on the second MOS transistor at the same time or subsequent to the first MOS transistor; and
switch off the second MOS transistor upon detection that the voltage between cathode and anode reaches a third threshold voltage.

22. The rectifier device of claim 20,
wherein the control logic is configured to mask out, for a specific masking time, any detection that the voltage between cathode and anode reaches the second threshold voltage, and
wherein the safety circuit remains active during the masking time.

23. The rectifier device of claim 22, wherein the masking time is adjusted based on an on-time of the first semiconductor switch in a previous cycle of the voltage between cathode and anode terminal.

24. A method for operating a rectifier device that comprises a MOS transistor and a diode coupled in parallel between an anode terminal and a cathode terminal, the method comprising:
detecting that the diode is forward biased;
switching on, by a control circuit, the MOS transistor upon detection that the diode is forward biased;
detecting, while the diode is forward biased, that a voltage across the rectifier device between the cathode terminal and the anode terminal reaches a specific threshold voltage, wherein the detection that the voltage across the rectifier device has reached the specific threshold value is masked during a masking time following the switch-on of the MOS transistor;
switching off the MOS transistor upon detection that the voltage across the rectifier device has reached the specific threshold value;
detecting that a voltage between cathode and anode terminal rises above a safety threshold, wherein the detection that the safety threshold has been hit is effective during the masking time; and
switching off, by the control circuit, the MOS transistor upon detection that the safety threshold has been hit.

25. The method of claim 24, further comprising generating an internal supply voltage for the control circuit, based on the voltage across the rectifier device between the cathode terminal and the anode terminal,
wherein an electric potential at the anode terminal is used as ground potential for the control circuit.

26. The method of claim 25, wherein the MOS transistor is a first MOS transistor, wherein the rectifier device comprises a further MOS transistor coupled in parallel to the diode between the anode terminal and the cathode terminal, the method further comprising:
switching on, by the control circuit, the further MOS transistor upon detection that the diode is forward biased;
detecting, after the first MOS transistor has been switched off, that the voltage across the rectifier device between the cathode terminal and the anode terminal reaches a specific further threshold voltage; and
switching off the further MOS transistor upon detection that the voltage across the rectifier device has reached the specific further threshold value.

27. A rectifier device comprising:
an anode terminal and a cathode terminal connected by a first load current path of a first MOS transistor, a second load current path of a second MOS transistor connected in parallel to the first load current path of the first MOS transistor, and a diode connected parallel to the load current path; an alternating input voltage is operably applied between the anode terminal and the cathode terminal; the electrical potential at the anode terminal serving as reference potential for the rectifier device; and
a control circuit comprising:
control logic configured to switch on the first MOS transistor for an on-time period, during which the diode is forward biased;
a safety circuit configured to trigger a switch-off of the first MOS transistor when the input voltage reaches a safety threshold; and
at least one comparator circuit configured to compare a voltage at the cathode terminal with at least one threshold voltage; wherein the comparator receives, as a first input signal, a level-shifted and scaled representation of the voltage at the cathode terminal, and uses, as a second input signal, a level shifted and a scaled version of the at least one threshold voltage.

28. The rectifier device of claim 27, wherein the scaling of the voltage at the cathode terminal is accomplished by a voltage divider and the level shifting by injecting a bias current into the voltage divider.

29. The rectifier device of claim 27, wherein the control logic is configured to switch on the first MOS transistor and the second MOS transistor subsequently or substantially at the same time.

30. The rectifier device of claim 27, wherein the control logic is configured to switch the second MOS transistor off later than the first MOS transistor.

31. The rectifier device of claim 30,
wherein the control logic configured to detect the end of the on-time period by detecting that a voltage between cathode and anode terminal has reached a defined second threshold voltage, and
wherein the second MOS transistor is switched off upon detection that the voltage between cathode and anode terminal has reached a defined third threshold voltage after the first MOS transistor has been switched off.

32. The rectifier device of claim 31, wherein the third threshold voltage is closer to zero than the second threshold voltage.

33. A rectifier device comprising:
an anode terminal and a cathode terminal connected by a load current path of a first MOS transistor and a diode connected parallel to the load current path; an alternating input voltage is operably applied between the anode terminal and the cathode terminal; and
a control circuit comprising:
control logic configured to:
switch on the first MOS transistor for an on-time period, during which the diode is forward biased, wherein an electrical potential at the anode terminal serves as reference potential for the control logic; and
detect a beginning of the on-time period when the input voltage falls below a first threshold voltage that is negative with respect to the reference potential; and
a safety circuit configured to trigger a switch-off of the first MOS transistor when the input voltage reaches a safety threshold.

34. A rectifier device comprising:
an anode terminal and a cathode terminal connected by a load current path of a first MOS transistor and a diode connected parallel to the load current path; an alternating input voltage is operably applied between the anode terminal and the cathode terminal; and
a control circuit comprising:
control logic configured to:
switch on the first MOS transistor for an on-time period, during which the diode is forward biased, wherein an electrical potential at the anode terminal serves as reference potential for the control logic;
detect a beginning of the on-time period when the input voltage falls below a first threshold voltage that is negative with respect to the reference potential; and
detect an ending of the on-time period when the input voltage reaches a second threshold voltage that is also negative with respect to the reference potential; and
a safety circuit configured to trigger a switch-off of the first MOS transistor when the input voltage reaches a safety threshold.

35. A method for operating a rectifier device that comprises a MOS transistor and a diode coupled in parallel between an anode terminal and a cathode terminal, the method comprising:
generating an internal supply voltage for a control circuit based on a voltage across the rectifier device between the cathode terminal and the anode terminal, wherein an electric potential at the anode terminal is used as ground potential for the control circuit;
detecting that the diode is forward biased;
switching on, by a control circuit, the MOS transistor upon detection that the diode is forward biased;
detecting, while the diode is forward biased, that the voltage across the rectifier device between the cathode terminal and the anode terminal reaches a specific threshold voltage;
switching off the MOS transistor upon detection that the voltage across the rectifier device has reached the specific threshold value;
detecting that a voltage between cathode and anode terminal rises above a safety threshold; and
switching off, by the control circuit, the MOS transistor upon detection that the safety threshold has been hit.

36. A method for operating a rectifier device that comprises a first MOS transistor, a diode coupled in parallel between an anode terminal and a cathode terminal, a further MOS transistor coupled in parallel to the diode between the anode terminal and the cathode terminal, the method comprising:
detecting that the diode is forward biased;
switching on, by a control circuit, the first MOS transistor upon detection that the diode is forward biased;
switching on, by the control circuit, the further MOS transistor upon detection that the diode is forward biased;
detecting, while the diode is forward biased, that a voltage across the rectifier device between the cathode terminal and the anode terminal reaches a specific threshold voltage;
switching off the MOS transistor upon detection that the voltage across the rectifier device has reached the specific threshold value;
detecting, after the first MOS transistor has been switched off, that the voltage across the rectifier device between the cathode terminal and the anode terminal reaches a specific further threshold voltage;
detecting that a voltage between cathode and anode terminal rises above a safety threshold;
switching off, by the control circuit, the first MOS transistor upon detection that the safety threshold has been hit; and
switching off the further MOS transistor upon detection that the voltage across the rectifier device has reached the specific further threshold value.

* * * * *